United States Patent
Wang et al.

(10) Patent No.: US 9,559,231 B2
(45) Date of Patent: Jan. 31, 2017

(54) PHOTOVOLTAIC NANOWIRE STRUCTURES AND RELATED FABRICATION METHODS

(75) Inventors: Shih-Ping Wang, Los Altos, CA (US); Yu-Min Houng, Cupertino, CA (US); Nobuhiko Kobayashi, Sunnyvale, CA (US)

(73) Assignee: Shih-Ping Bob Wang, Los Altos, CA (US)

( * ) Notice: Subject to any disclaimer, the term of this patent is extended or adjusted under 35 U.S.C. 154(b) by 590 days.

(21) Appl. No.: 13/821,963

(22) PCT Filed: Sep. 9, 2011

(86) PCT No.: PCT/US2011/051091
§ 371 (c)(1),
(2), (4) Date: Oct. 22, 2013

(87) PCT Pub. No.: WO2012/034078
PCT Pub. Date: Mar. 15, 2012

(65) Prior Publication Data
US 2014/0034120 A1    Feb. 6, 2014

Related U.S. Application Data

(60) Provisional application No. 61/381,930, filed on Sep. 10, 2010, provisional application No. 61/390,732, (Continued)

(51) Int. Cl.
*H01L 31/0352* (2006.01)
*H01L 21/02* (2006.01)
(Continued)

(52) U.S. Cl.
CPC . *H01L 31/035236* (2013.01); *H01L 21/02521* (2013.01); *H01L 21/02603* (2013.01);
(Continued)

(58) Field of Classification Search
CPC .......... H01L 31/02521; H01L 31/026036; H01L 31/035227; H01L 21/02521; H01L 21/02603; H01L 21/02639; Y02P 70/521
(Continued)

(56) References Cited

U.S. PATENT DOCUMENTS 7,115,971 B2   10/2006   Stumbo et al.
7,601,597 B2   10/2009   Takei
(Continued)

OTHER PUBLICATIONS

Houng et al., "Characterization of the Nanoporous Template Using Anodic Alumina Method", Journal of Nanomaterials, vol. 2014, Article ID 130716, pp. 1-7.*
(Continued)

*Primary Examiner* — Matthew Martin
*Assistant Examiner* — Tae-Sik Kang
(74) *Attorney, Agent, or Firm* — Cooper & Dunham LLP

(57) ABSTRACT

Nanowire-based photovoltaic energy conversion devices and related fabrication methods therefor are described. A plurality of photovoltaic (PV) nanowires extend outwardly from a surface layer of a substrate, each PV nanowire having a root end near the substrate surface layer and a tip end opposite the root end. For some embodiments, a collar material is formed that laterally surrounds and is in contact with the PV nanowires along a portion of one or more of their ends. According to some embodiments, the PV nanowires are formed on a crystalline silicon substrate. According to some other embodiments, the PV nanowires are formed on a roll-sourced continuous substrate.

6 Claims, 14 Drawing Sheets

Related U.S. Application Data filed on Oct. 7, 2010, provisional application No. 61/415,943, filed on Nov. 22, 2010, provisional application No. 61/450,107, filed on Mar. 7, 2011, provisional application No. 61/526,629, filed on Aug. 23, 2011.

(51) Int. Cl.

| | | |
|---|---|---|
| *H01L 31/0392* | (2006.01) | |
| *H01L 31/075* | (2012.01) | |
| *H01L 31/18* | (2006.01) | |
| *H01L 31/20* | (2006.01) | |

(52) U.S. Cl.
CPC .. *H01L 21/02639* (2013.01); *H01L 21/02664* (2013.01); *H01L 31/03921* (2013.01); *H01L 31/035227* (2013.01); *H01L 31/075* (2013.01); *H01L 31/18* (2013.01); *H01L 31/1804* (2013.01); *H01L 31/206* (2013.01); *Y02E 10/547* (2013.01); *Y02E 10/548* (2013.01); *Y02P 70/521* (2015.11)

(58) Field of Classification Search
USPC .............................................. 136/255; 438/87
See application file for complete search history.

(56) References Cited

U.S. PATENT DOCUMENTS

| | | | |
|---|---|---|---|
| 7,674,563 | B2 | 3/2010 | Suda |
| 7,893,348 | B2 | 2/2011 | Korevaar et al. |
| 8,129,710 | B2 | 3/2012 | Cho et al. |
| 2008/0047604 | A1* | 2/2008 | Korevaar ............... B82Y 20/00 136/258 |
| 2008/0265449 | A1 | 10/2008 | Meinders et al. |
| 2009/0188557 | A1 | 7/2009 | Wang et al. |
| 2010/0029067 | A1* | 2/2010 | Vijh ...................... C23C 14/562 438/478 |
| 2010/0126548 | A1 | 5/2010 | Jang et al. |
| 2010/0193768 | A1* | 8/2010 | Habib ............... H01L 31/03529 257/9 |
| 2010/0197068 | A1 | 8/2010 | Poon et al. |
| 2010/0221866 | A1* | 9/2010 | Graham .......... H01L 31/035227 438/73 |
| 2010/0313941 | A1* | 12/2010 | Huang ............ H01L 31/035281 136/255 |

OTHER PUBLICATIONS

Dec. 23, 2011 International Search Report and Written Opinion in connection with corresponding with PCT/2011/051091.

* cited by examiner

STEP 1: FORM LAYER OF n-TYPE AMORPHOUS Si

STEP 2: FORM VERY THIN MASK LAYER OF SiO2 (OR OTHER OXIDE)

STEP 3: INTRODUCE NANOWIRE PRECURSOR GASES AT HIGH TEMPERATURE TO GROW NANOWIRES THROUGH THE RANDOM, IRREGULARLY SHAPED MASK LAYER OPENINGS

PHOTOVOLTAIC NANOWIRE STRUCTURES AND RELATED FABRICATION METHODS

CROSS-REFERENCE TO RELATED APPLICATIONS

This application is related to, and claims the benefit of, each of the following U.S. Provisional Patent Applications: U.S. Prov. Ser. No. 61/381,930, filed Sep. 10, 2010; U.S. Prov. Ser. No. 61/390,732, filed Oct. 7, 2010; U.S. Prov. Ser. No. 61/415,943, filed Nov. 22, 2010; U.S. Prov. Ser. No. 61/450,107, filed Mar. 7, 2011; and U.S. Prov. Ser. No. 61/526,629, filed 23 Aug. 2011. This application is related to the subject matter of the following applications: U.S. Prov. Ser. No. 61/236,144, filed Aug. 24, 2009; U.S. Prov. Ser. No. 61/263,315, filed Nov. 20, 2009; U.S. Prov. Ser. No. 61/264,194, filed Nov. 24, 2009; U.S. Prov. Ser. No. 61/295,500, filed Jan. 15, 2010; U.S. Prov. Ser. No. 61/295,579, filed Jan. 15, 2010; U.S. Prov. Ser. No. 61/295,606, filed Jan. 15, 2010; U.S. Prov. Ser. No. 61/309,414, filed Mar. 1, 2010; International Application No. PCT/US10/46334 filed Aug. 23, 2010; and U.S. Prov. Ser. No. 61/376,358, filed Aug. 24, 2010. Each of the above-referenced applications is incorporated by reference herein in its entirety.

FIELD

This patent specification relates to photovoltaic energy conversion devices, such as may be used in photovoltaic solar cells and solar panels. More particularly, this patent specification relates to nanowire-based photovoltaic energy conversion devices, as well as systems and methods for fabricating such devices.

BACKGROUND

Solar electric power generation systems, particularly those based on photovoltaic solar panels, continue to gain popularity in efforts to shift away from supply-limited, greenhouse-gas producing fossil fuels to more environmentally friendly and sustainable forms of energy. Most of today's conventional rooftop photovoltaic solar panels comprise side-by-side arrangements of relatively large (e.g., 5 cm×5 cm, 10 cm×10 cm) bulk monocrystalline or bulk multicrystalline silicon wafers processed to form depthwise p-n junctions. Manufacture of the bulk crystalline silicon wafers is highly energy-intensive and expensive, and the power conversion efficiency of the resultant devices is typically only in the range of 15% to 20%. A chronic shortage in the supply of bulk crystalline silicon wafers has plagued the industry in recent years, a shortage that is expected by some forecasters to reach crisis proportions in coming years. Although thin-film photovoltaic cells fabricated from amorphous silicon or chalcogenide compounds require less semiconductor material than those based on bulk crystalline silicon wafers and are less energy-intensive and less costly to produce, their power conversion efficiencies are even lower, usually in the 6% to 10% range.

Proposals have been set forth for using semiconducting nanowires as a basis for photovoltaic solar energy conversion. Nanowires are small self-assembled structures having lengths typically in the range of 0.5 μm-5 μm and diameters typically in the range of 10 nm-1000 nm. One method of fabricating nanowires uses a vapor-liquid-solid ("VLS") synthesis process, sometimes termed a catalytic growth process. A catalyst material such as gold or titanium is deposited on a substrate at a large number of spots thereacross, each spot being a location at which a nanowire will be grown. The substrate with the catalyst is then placed in a reaction chamber and heated to high temperatures (e.g., 250° C.-1000° C.). Precursor gases, including the elements or compounds that will form the nanowires, are introduced into the chamber. Under the influence of the catalyst, the precursor gases at least partially decompose into their respective elements, some of which are transported on or through the catalyst in liquified phase to the immediately underlying solid surface provided by the substrate. At each spot, a nanowire epitaxially grows outwardly from the substrate as the process proceeds, the catalyst at each spot remaining at the tip of the nanowire and rising away from surface of the substrate as the nanowire grows. The resultant nanowires exhibit a long-range atomic order (i.e., single-crystal) that can potentially be exploited for a variety of different useful applications. So-called self-catalytic growth of nanowires has also been reported in the literature.

During nanowire formation, the elements or compounds used to form the nanowires can be varied, such that the material composition and/or semiconductor doping level of each nanowire is variable along the longitudinal length of that nanowire. In one known scenario relevant to the preferred embodiments herein, the longitudinally varying material and/or doping profile can be designed such that each nanowire exhibits a photovoltaic property, i.e., is capable of absorbing incident photons and providing an associated photocurrent to an external load (if properly electrically connected to that load). As used herein, PV nanowire refers to any of a variety of nanowires themselves or related structures that employ nanowires and are capable of exhibiting photovoltaic properties, such photovoltaic properties arising from any of a variety of different material selections, material compositional and spatial chemical profiles, and/or doping profiles thereof. By way of non-limiting example, PV nanowires can comprise one or more longitudinal homojunctions (e.g., p-n, p-i-n, p-n-p, n-p-n homojunctions), one or more longitudinal heterojunctions (e.g., materials containing various chemical elements and/or various chemical compositions and various bandgaps), and/or portions of such homojunctions or heterojunctions that are completed by virtue of the materials and/or doping profiles immediately opposite the longitudinal end(s) of the nanowire. One example of a PV nanowire-based solar cell is described in US 2007/0267625 A1, which is incorporated by reference herein in its entirety.

Advantageously, PV nanowire-based solar cells can provide power conversion efficiencies that are as great, or even greater, than solar cells based on bulk crystalline wafers made of a same material. For example, it is believed at least theoretically possible to achieve PV nanowire-based solar cells composed of III-V semiconductor material having 35 percent, and perhaps even 40 percent, energy conversion efficiency, which is as high or better than photovoltaic cells made with bulk crystalline semiconductor wafers. At the same time, because they can be built upon low-cost substrates with low material utilization and comparatively low energy requirements, PV nanowire-based solar cells can be fabricated at a fraction of the cost of comparable solar cells based on bulk crystalline wafers.

One or more issues may arise in the design and/or fabrication of PV nanowire-based solar cells that is at least partially resolved by one or more of the preferred embodiments described herein. One issue that may arise in PV nanowire-based solar cells relates to the need for an electrode to be provided on each side of the PV nanowire array, including a root-side electrode corresponding to the roots of the PV nanowires and a tip-side electrode corresponding to the tips of the PV nanowires. The need to provide good electrical contact and conductivity at these electrodes can present substantial limitations on the type, complexity, and orientation of the overall PV nanowire-based solar cells, because structures providing the good electrical contact and conductivity can often prove to be light-absorbing or light-reflecting, thereby reducing the percentage of photons able to reach the PV nanowire junctions. For PV nanowire-based solar cells that are based on longitudinal p-i-n junctions, another issue that may arise relates to the quality of p-type, intrinsic-type, and n-type semiconductor material that physically forms the PV nanowire for achieving optimum photovoltaic performance.

One issue that can affect the performance of PV nanowire-based solar cells is carrier loss due to charge recombination occurring along the surface of the PV nanowires. Charge recombination is a loss process in which an electron, which has been photo-excited from the valence band to the conduction band of a semiconductor, falls back into an empty state (hole) in the valence band. Charges that recombine do not produce any photocurrent and, hence, do not contribute toward solar cell efficiency. Charge recombination losses can be particularly strong along the surface of a semiconductor material, where dangling bonds give rise to certain surface states that greatly facilitate the electron-hole recombination process. Because the recombination losses associated with surfaces scale with total surface area, the problem becomes particularly amplified for nanowires having high surface-to-volume ratio. Generally speaking, the recombination losses at surfaces tend to be more problematic for III-V compound semiconductor PV nanowires than for silicon PV nanowires for which stable natural oxide (i.e., $SiO_2$) that can be easily formed on Si surfaces can greatly reduce the density of surface states. Other issues may arise as would be apparent to one skilled in the art upon reading the present disclosure.

SUMMARY

According to some embodiments, a method for fabricating a photovoltaic energy conversion device is described. The method includes providing a substrate including a substrate surface layer doped in a first dopant type (e.g. n-type or p-type); growing a plurality of photovoltaic (PV) nanowires outwardly from the substrate surface layer, each PV nanowire having a root end near the substrate surface layer and a tip end opposite the root end; forming a layer of collar material that laterally surrounds and is in contact with the PV nanowires along at least a rootward portion of their lengths, the collar material doped in the first dopant type; and forming a tip-side doped material doped in a second dopant type, the tip-side doped material in contact with the tip ends of the PV nanowires.

According to some embodiments the layer of collar material is grown in a lateral direction from the PV nanowires, and a layer of optically transparent, electrically insulating solid filler material is provided that laterally surrounds the PV nanowires along an outward portion of their lengths. A longitudinal p-i-n junction is preferably associated with each PV nanowire. According to some embodiments, the growing of PV nanowires is partially carried out before the forming of the collar material and partially carried out after the forming of the collar material, such that a gap between 0.2 microns and 5 microns is formed between an outward-most portion of the collar material a rootward most portion of the tip-side material. The PV nanowires are not intentionally doped, according to some embodiments. In such cases the PV nanowires preferably have impurity levels less than $10^{17}$ per cubic centimeter.

According to some embodiments, a method for fabricating a photovoltaic energy conversion device it described that includes: providing a substrate including an n-doped substrate surface layer; growing a plurality of n-doped photovoltaic (PV) nanowires outwardly from the substrate surface layer, each PV nanowire having a root end near the substrate surface layer and a tip end opposite the root end; forming a layer of optically transparent, electrically insulating solid filler material that laterally surrounds the PV nanowires along a portion of their lengths; and forming a tip-side p-doped material in contact with the tip ends of the PV nanowires. According to some embodiments, the tip-side p-doped material is p+ or p++ type doped.

According to some embodiments, a method for fabricating a photovoltaic energy conversion device is described that includes: providing a 6" by 6" square substrate including a substrate surface layer on which the PV nanowires and other structures are formed.

According to some embodiments, a method for fabricating a photovoltaic energy conversion device is described, that includes forming a mask layer on the substrate surface layer, the mask having a plurality of spaced apart voids such that portions of the substrate surface layer are exposed at the locations of the voids. The photovoltaic (PV) nanowires are grown outwardly from the exposed portions of the substrate surface layer.

According to some embodiments, a method for fabricating a photovoltaic energy conversion device is described that includes providing a substrate including a long range atomic order (LRAO) substrate surface layer (such as a highly n-type doped <111> crystallographic plane of the silicon wafer); and growing a plurality of n-doped photovoltaic (PV) nanowires outwardly from the LRAO substrate surface layer.

According to some embodiments, a method for fabricating a photovoltaic energy conversion device is described that includes providing a roller-based substrate material including a substrate surface layer with short range atomic order (SRAO) such as polysilicon or amorphous silicon, on which the PV nanowires and other structures are formed.

According to some embodiments, a photovoltaic energy conversion device is provided that is fabricated according to the methods described herein.

DESCRIPTION

Figure 1:
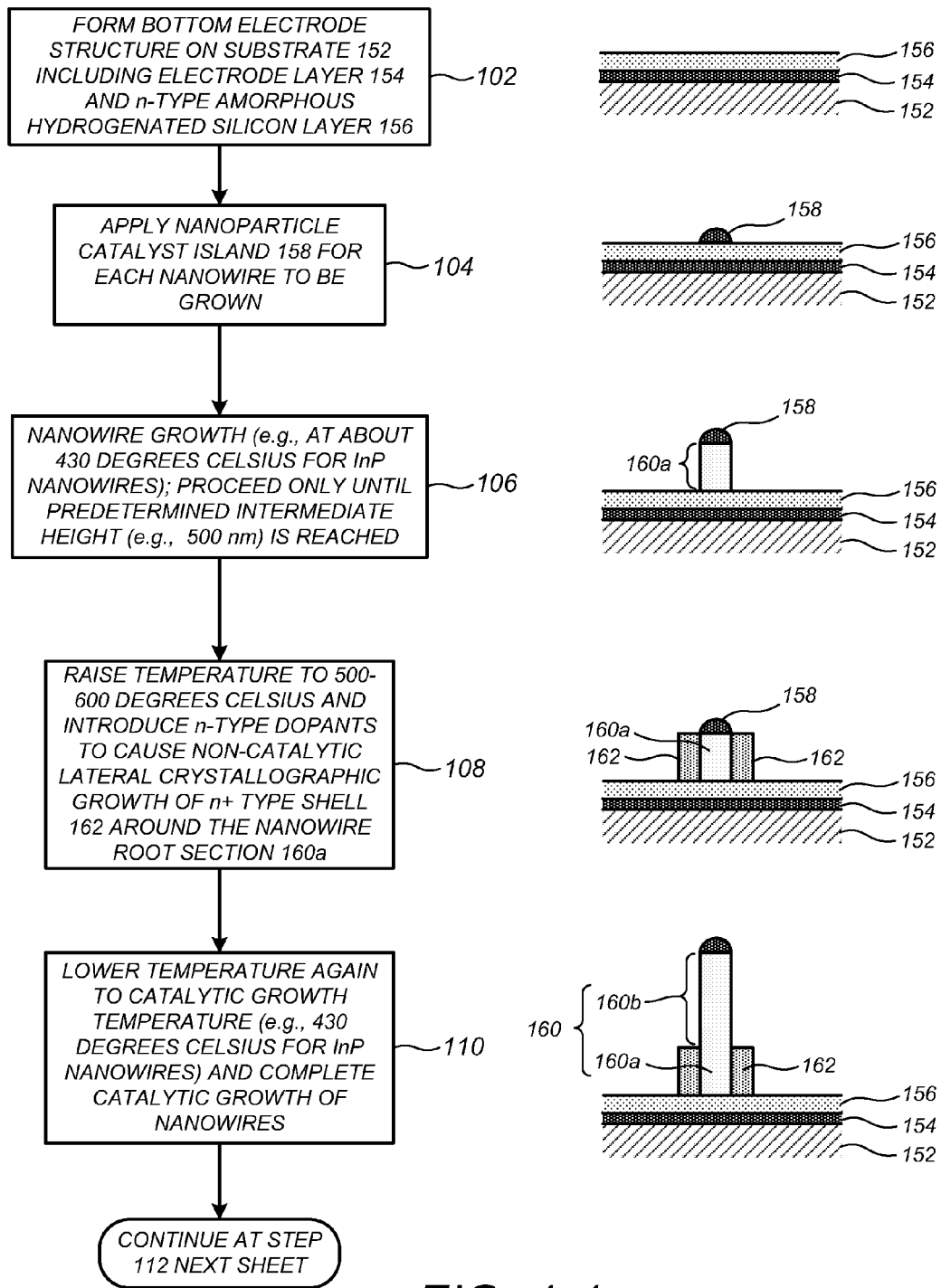
FIG. 1 illustrates fabricating a PV nanowire structure according to some preferred embodiments.

One or more aspects of the preferred embodiments hereinbelow may be further understood in view of selected background references from the non-patent literature identified in the list that follows. The listed references, each of which is incorporated by reference herein in its entirety, are referenced further hereinbelow by their respective identifying numerals.

{1} Kobayashi, et. al., "Metal Organic Chemical Vapor Deposition of Indium Phosphide Nanoneedles on Non-Single Crystal Silicon Surfaces," Proc. SPIE, Vol. 6370, 63700S-1-8 (2006);

{2} Kobayashi, et. al., "Growth and Characterization of Indium Phosphide Single-Crystal Nanoneedles on Microcrystalline Surfaces," Appl. Phys. A, Vol. 85, 1-6 (2006);

{3} Kobayashi, et. al., "Ensembles of Indium Phosphide Nanowires: Physical Properties And Functional Devices Integrated On Non-Single Crystal Platforms," Appl. Phys. A, Vol. 95, 1005-1013 (2009);

{4} Goto, et. al., "Growth of Core-Shell InP Nanowires for Photovoltaic Application by Selective-Area Metal Organic Vapor Phase Epitaxy," Applied Physics Express 2, 035004-1-3 (2009);

{5} Singh, et. al., "Reduction in Surface Charge Density By New GaAs Passivation Method," J. Phys. D: Appl. Phys., Vol. 8, L42-43 (1975);

{6} Kalhor, et. al., "Annealing Effects on Opto-electronic Properties of Thermally-Evaporated ITO/Ag/ITO Multi-layered Films for Use in Color Filter Electrodes," World Applied Sciences Journal 6 (1): 83-87 (2009);

{7} Perkins, et. al., "Combinatorial Optimization of Transparent Conducting Oxides (TCOs) for PV," 31$^{st}$ IEEE Photovoltaics Specialists Conference and Exhibition, Lake Buena Vista, Fla., Jan. 3-7, 2005, NREL/CP 520-37420 (2005);

{8} Pern, et. al., "Accelerated Exposure Tests of Encapsulated Si Solar Cells and Encapsulation Materials," National Center for Photovoltaics Program Review Meeting, Denver, Colo., Sep. 8-11, 1998, NREL/CP-520-25361 (1998);

{9} Guillen, et. al., "ITO/Metal/ITO Multilayer Structures Based On Ag and Cu Metal Films for High Performance Transparent Electrodes," Solar Energy Materials and Solar Cells, Vol. 92, Issue 8, pp. 938-941 (2008);

{10} Iyer, R., "Sulfur as a Surface Passivation for InP," Appl. Phys. Lett. 53 (2) (1988);

{11} Voyles, et. al., "Absence of an Abrupt Phase Change from Polycrystalline to Amorphous in Silicon with Deposition Temperature," Phys. Rev. Lett. 86 (24), pp. 5514-5517 (2001); and {12} Gao, L., et. al., "Self-Catalyzed Epitaxial Growth of Vertical Indium Phosphide Nanowires on Silicon," Nano Lett. 9 (6), pp 2223-2228 (2009).

PV nanowires can be formed (e.g., catalytically grown or otherwise generated) upon substrates having different types of surface characteristics. PV nanowires can, of course, be formed upon substrates that exhibit long-range crystallographic order along their surfaces, including cost-intensive bulk crystalline wafer substrates. However, as described in {2}-{3}, supra, PV nanowires can also be formed upon substrates that do not exhibit long-range crystallographic order along their surfaces, but that do exhibit short-range crystallographic order along their surfaces at the locations of the nanowires to be formed. For purposes of the present description, the term short range atomic order (SRAO) is used interchangeably with the term short range crystallographic order. The material providing the short-range atomic order, termed herein SRAO material, can be different or the same as the underlying material that forms the bulk of the substrate. When different from the underlying substrate material, the SRAO material can be formed as a very thin layer thereupon, which can be termed a template layer. Advantageously, the substrate material underlying the SRAO template layer can be any material suitable to provide mechanical and/or electrical support for the SRAO template layer regardless of the presence or absence of crystalline character, provided only that its properties are otherwise consistent with the purpose of the apparatus to be built. By way of example, the bulk of the substrate can comprise amorphous silicon dioxide, quartz, stainless steel, or chromium. By way of example, the SRAO template layer can be a 100-nm thick film of hydrogenated amorphous silicon or hydrogenated microcrystalline silicon.

If the PV nanowires are formed upon a substrate whose surface exhibits long range atomic order, it is more likely that a high percentage of the nanowires will be in geometric alignment with each other and that their tips will rise to similar heights above the substrate surface. If the PV nanowires are formed upon a substrate having an short range atomic order (SRAO) material surface, the population of PV nanowires will be more likely to have a lesser degree of alignment due to the multiple different crystallographic directions imposed upon the population of PV nanowires, and there will be greater variation in the heights of their tips above the substrate surface. The preferred PV nanowire-coupling fabrication methods described hereinbelow are presented in the context of PV nanowires formed upon substrates having SRAO material surfaces. In addition to representing the more difficult (and more general) case due to greater variation in PV nanowire tip heights, the latter also represents a more commercially desirable case due to the availability of lower-cost fabrication processes, such as roll-based manufacturing processes, associated with the wide flexibility in bulk substrate material choices. It is nevertheless to be appreciated, however, that the described methods are readily applicable in the context of PV nanowires formed upon substrates whose surfaces exhibit long range atomic order, such as bulk crystalline wafer substrates.

In relation to the description that follows, it is to be readily understood that the "positive" and "negative" electrical polarities can of course be reversed depending on the material structures and doping profiles of the PV nanowires. For one or more of the examples presented herein, the "top" direction corresponds to an outward direction relative to a surface of the substrate from which the PV nanowires are grown. However, it is to be appreciated that the terms "top" and "bottom" are used for convenience of description and do not imply any particular orientation relative to gravity, nor do they imply any particular direction of solar radiation entry into the PV nanowire array.

Figure 2A:
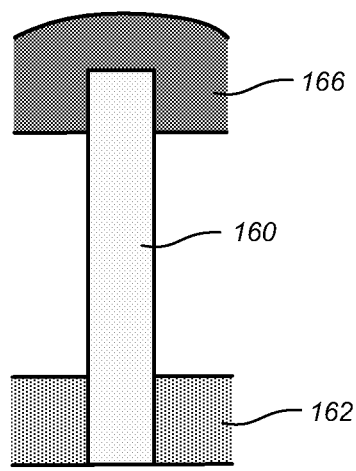
FIG. 2A illustrates a simplified cross-sectional view of one of the PV nanowire structures formed according to the method of FIG. 1.
Figure 2B:
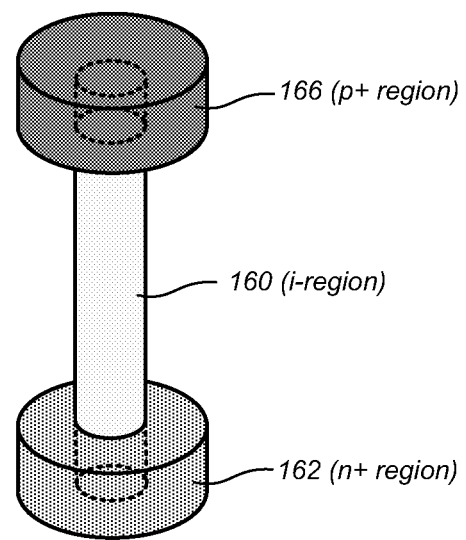
FIG. 2B illustrates a simplified perspective view thereof.

FIG. 1 illustrates fabricating a PV nanowire structure according to some preferred embodiments. FIG. 2A illustrates a simplified cross-sectional view of one of the PV nanowire structures formed according to the method of FIG. 1, while FIG. 2B illustrates a simplified perspective view thereof. At step 102, a bottom electrode layer 154 is formed upon a substrate 152, and a layer 156 of n-type amorphous hydrogenated silicon (n-type a-Si:H) is formed on the bottom electrode layer 154. The bulk of the substrate 152 substrate can comprise, for example, amorphous silicon dioxide, quartz, stainless steel, chromium, or an optically transparent glass. The bottom electrode layer can comprise, for example, a metal such as molybdenum or aluminum.

At step 104 a nanoparticle catalyst island 158, comprising for example gold or platinum, is formed on the n-type a-Si:H layer 156 at each location where a nanowire is to be grown. The catalyst island 158 will be shaped and dimensioned according to the desired profile of the nanowire to be grown. In one example, the catalyst island 158 can be generally circular with a diameter in the range of 50 nm-500 nm.

At step 106, catalytic nanowire growth is commenced, for example at a temperature of 430 degrees Celsius for InP nanowires, in conjunction with the introduction of appropriate precursor gases into the growth chamber. However, according to a preferred embodiment, the nanowire growth process proceeds only to a time when the nanowire tips are at a predetermined intermediate height, such as 500 nm, above the surface of the n-type a-Si:H layer. At this point, as illustrated in FIG. 1, only a root section 160a of a nanowire has been formed.

At step 108, the temperature is then raised to 500-600 degrees, and the precursor gases used in step 106 are kept the same except that n-type dopants are also introduced into the reaction chamber. Due to the raised temperature, the upward nanowire growth, as catalyzed by the nanoparticle catalyst island 158, stops occurring. Instead a more standard (non-catalytic) crystallographic growth of the InP material occurs, with the lateral sides of the root section 160a serving as a "substrate" for that growth. Accordingly, at step 108 the growth proceeds laterally, rather than upwardly, to form what is essentially a cylindrical shell 162 of InP material around the root section 160a, and because n-type dopants are introduced, the InP shell 162 is an n+ type shell. The lateral growth of the n+ type shell 162 proceeds until its thickness (i.e., the amount that it extends laterally outward from the root section 160a) is comparable to the diameter of the root section 160a, e.g., about 500 nm. Suitable n-type dopants for step 108 include, for example, Te, Sn, and Si for the case of InP nanowires. Notably, it is acceptable and can indeed be advantageous if some n-doping of the nanowire root section 160a occurs during the step 108.

At step 110, subsequent to the formation of the n+ type shell 162, the temperature is again lowered to the previous catalytic nanowire growth temperature, such as 430 degrees Celsius for InP nanowires, and the upward catalytic nanowire growth process is resumed to form upper nanowire portions 160b, proceeding until completed nanowires 160 at their full ultimate intended height (such as between 2 μm to 5 μm, although the scope of the present teachings is not so limited) are formed. Optionally, after nanowire growth, a thin passivation layer can be applied on the surface of the nanowires to chemically and physically protect the nanowires and stabilize the surface of the nanowires to reduce the density of unfavorable surface states. Such thin passivation layer can be made by a technique such as atomic layer deposition that relies upon self-limiting surface chemical reaction of precursors containing desired chemical elements such that the voids among the nanowires will not be filled.

At step 112 an optically transparent, electrically insulating solid filler material layer 164 is applied, such as by spinning, such that the tips of the nanowires 160 are covered. For one preferred embodiment, the filler layer 164 comprises a spin-coating material, such as spin-on glass (SOG) or cyclotene, that is applied to the top of the nanowire array and then spun on. Notably, a variety of different materials for the solid filler layer 164 and methods for achieving the result of step 112 are within the scope of the preferred embodiments. For example, the solid filler layer 164 can alternatively comprise one or more of Si oxides, Si nitrides, Al oxide, Al nitride, or other materials that are optically transparent and electrically insulating, and methods of application other than spinning such as spraying and injecting via inkjet could be used.

At step 114, the solid filler layer 164 is subject to a dry etch, such as with O2 plasma, so that most of the nanowires 160 jut outwardly from an outward surface of the solid filler layer 164 and are available to make good physical and electrical contact with a tip-side electrode layer. Since the nanowires 160 are less affected by the etching, their tip ends will look much like stubble or whiskers sticking out of the solid filler layer 164. The solid filler layer 164 may advantageously provide at least some degree of passivation of the nanowire surfaces.

Figures 1, 2:
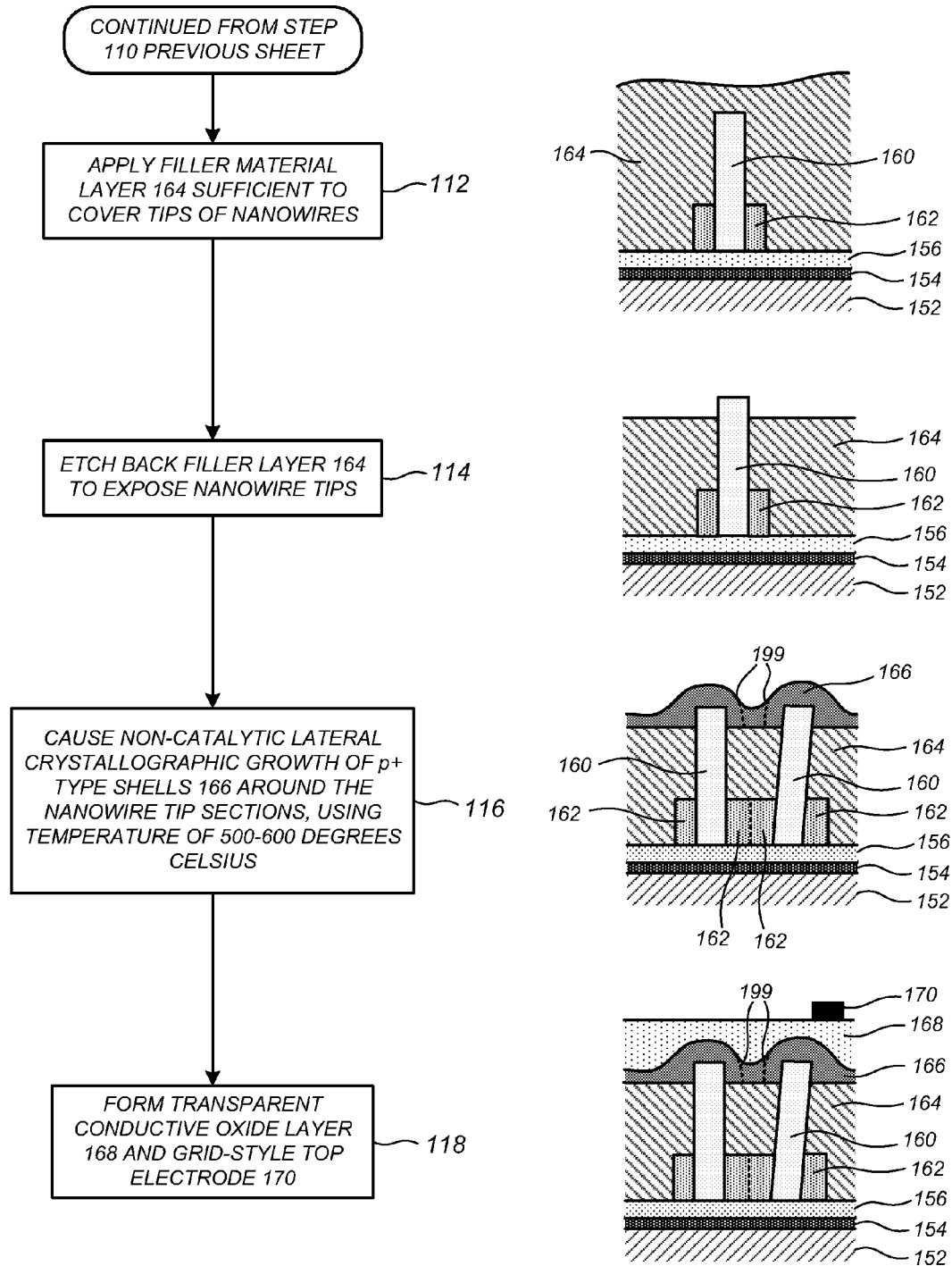

At step 116, the temperature is again raised to 500-600 degrees Celsius and the InP precursor gases introduced into the chamber, this time in the presence of p-type dopants, to form a p+ type shell 166 around the tip ends of the nanowires 160 in a lateral non-catalytic growth process similar to that described above for step 108. Suitable dopants for step 116 include, for example, Zn and Mg for the case of InP nanowires. Notably, it is acceptable and can indeed be advantageous if some p-doping of the nanowire tip sections occurs during the lateral growth process of step 116. Moreover, it is also acceptable and can be advantageous, as shown in the progress drawing adjacent to box 116 of FIG. 1, for the p+ type shells 166 of adjacent nanowires 160 to merge together. Alternatively, there can be formed a p+ type layer using any of a variety of materials having a bandgap greater than the 1.35 eV bandgap of InP, such as InGaP which has a bandgap of 1.82 eV. With reference back to step 108 and as illustrated by the dotted line in the progress drawing adjacent to box 116 of FIG. 1, it is also acceptable and can indeed be advantageous for the n+ type shells 162 to merge together during step 108. Note that although the shells 166 are shown as connected in FIG. 1-2, there may be a gap between them, as shown by the dotted lines 199.

Finally, at step 118, a transparent conductive oxide layer (TCL) 168 is formed upon and around the p+ type shells 166, and grid-style metal electrode 170 is formed to complete a tip-side electrode for the overall PV nanowire structure. As illustrated in FIGS. 2A-2B, each PV nanowire structure takes on an overall shape similar to that of a dumbbell, by virtue of the p+ type shells 166 near the nanowire tip and the n+ type shell 162 near the nanowire root. The resultant PV nanowire-based device provides an advantageously optimized combination of good p-i-n photovoltaic properties, good root-side and tip-side electrode connectivity and conductivity, mechanical and electrical stability, and amenability to roll-based fabrication methods.

Figure 3A:
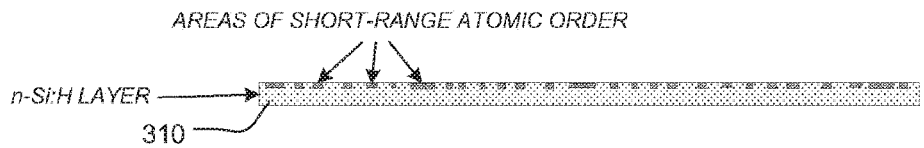
FIGS. 3A-C illustrate an alternative method of manufacture using a thin mask structure, according to some embodiments.
Figure 3B:
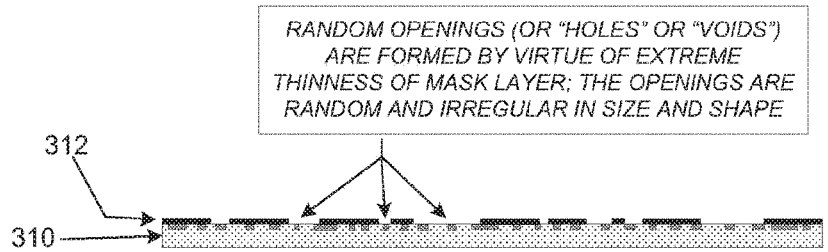
Figure 3C:
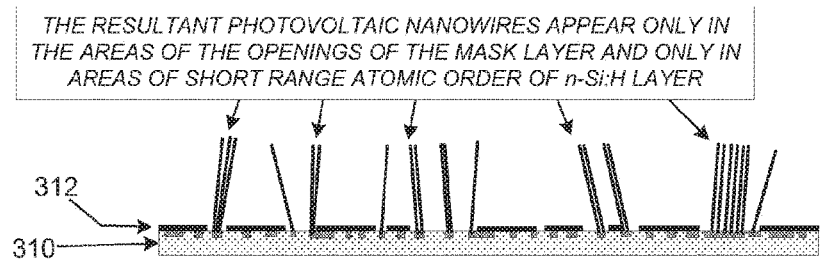

FIGS. 3A-C illustrate an alternative method of manufacture using a thin mask structure, according to some embodiments. One or more aspects of such embodiments may be further understood in view of selected background references from the non-patent literature identified in the list that follows. The listed references, each of which is incorporated by reference herein in its entirety, are referenced further hereinbelow by their respective identifying numerals.

{13} Li, R R and Dapkus, D., et. al., "Dense arrays of ordered GaAs nanostructures by selective area growth on substrates patterned by block copolymer lithography," App. Phys. Lett. 76(13), pp. 1689-1691 (27 Mar. 2000);

{14} Zhang, Y., et. al., "Patterned growth and field emission of ZnO nanowires," Materials Letters 60, pp. 522-526 (2006);

{15} Ho, S. T., et. al., "Catalyst-free selective-area growth of vertically aligned zinc oxide nanowires," Chemical Physics Letters 463, pp. 141-144 (2008);

{16} Zhang, Y., et. al., "Selective-area growth and field emission properties of Zinc oxide nanowire micropattern arrays," Physica B 382, pp. 76-80 (2006);

{17} Bauer, J., et. al., "GaAs nanowires grown by MOVPE," Phys. Status Solidi B 247, No. 6, 1294-1309 (2010); and {18} Dalacu, et. al., "Selective-area vapour-liquid-solid growth of InP nanowires," Nanotechnology 20, 395602 (6 pp.) (2009).

Provided according to a preferred embodiment are methods for forming photovoltaic (PV) nanowire-based solar cells, along with the resultant solar cells themselves, based on the methods of the incorporated patent references, together with the selective area growth strategies of the references {13}-{18} above, but with certain key differences as set forth hereinbelow. As illustrated in FIG. 3A, there is provided a short-range atomic order (SRAO) substrate 310, such as n-Si:H. In FIG. 3B, there is then provided a very thin mask layer of SiO2 (or other suitable oxide) 312 above the SRAO layer, a mask layer 312 is preferably so thin (for example, 2-5 nm) that it intrinsically contains a series of randomly and irregularly distributed, sized and shaped openings therethrough. The openings can alternatively be called "holes" or "voids," and the mask layer can be called a "holey film." The SRAO layer is exposed through those openings, and is not exposed elsewhere. In FIG. 3C, the PV nanowire precursor gases are introduced into the chamber at a relatively high temperature as needed for non-catalytic growth (in comparison to catalytic growth), and the PV nanowires grow non-catalytically through the random, irregular openings in the mask layer. The PV nanowires do not grow through the remaining mask areas, but rather only through the openings. The result is photovoltaic nanowires formed in spatially random clusters over the surface, as shown in FIG. 3C.

Stated differently, there is provided what it believed to potentially be a better alternative to the patterned selective area growth (SAG) method of growing nanowires without using catalyst. In contrast to the Dapkus idea in which a dielectric pattern is provided over a crystalline surface, the nanowires growing through areas not covered by the dielectric, according to some embodiments, a very thin dielectric film with lots of "holes," such as SiO2 (say 3 to 10 nm thick or so), is deposited to serve as a random pattern over crystalline or amorphous Si surface, and the nanowires will grow in areas not covered by the "holey" film.

Notably, the PV nanowires grown in this fashion could also be encouraged to grow laterally, by changing the growth temperature and other conditions, so that all the nanowires could become fat. It is also possible that the fat nanowires could simply grow together to form a quasi-continuous layer or film. Again, the nanowires could be made of InP, GaAs, GaN and other III-V materials. Notably, according to some embodiments, the lateral growth techniques described herein can be added to the ideas of the incorporated patent references above. There would be no need to deposit a larger catalyst grain. The nanowires could grow fat by changing the growth conditions and still have a tiny catalyst cap. The fat nanowires could again grow together to form a quasi-continuous film as described above.

A method of making III-V microwire solar cell modules compatible to silicon crystal modules will now be described, according to some embodiments. The modules can use minimally modified silicon crystal module manufacturing and handling equipment as well as fitting into the standard panels for silicon crystal modules. This is particularly important for cost and manufacturing yield considerations.

Since approximately 80% of the solar cell modules are made of silicon crystal and the costs of such manufacturing and handling equipment are well designed and proven at a much lower cost than specialized equipment for typical thin-film solar cell modules. This cost advantage also applies to the standard panels and mounting fixtures.

A typical silicon solar cell module is six-inch square (6"×6"), made from an eight-inch (8") silicon wafer. It takes approx. 43 of these modules to add up to a square meter. Thus, each silicon crystal module typically delivers 3.5 W or less. Whereas, each such size (6"×6") III-V microwire solar cell module should deliver 7 W. For a silicon crystal solar cell manufacturing plant of GW/year (one billion watt/year) capacity, it would have to produce 800,000 such 6"×6" modules per day×360 days/year. If yield were 80%, then the daily run rate would be over one million modules per day.

According to one preferred embodiment, III-V microwire solar cells are fabricated according to one or more of the methods described in the above-referenced applications that are incorporated by reference herein, with the additional constraint that they are made in discrete, individually manipulable plates or sections having unit sizes that correspond to the sizes of conventional silicon crystal wafers. The III-V microwire solar cell units or plates are formed such that they can be "substituted" in place of the conventional silicon crystal wafers in a conventional solar cell module-making process, with only relatively minor modifications to that process. The result is solar panel modules that have the general look, feel, and applicability of conventional solar panels, except that they are advantageously based on III-V microwire-based solar cell technology instead of conventional silicon crystal wafers.

Thus, for example, according to one preferred embodiment, the III-V microwire solar cell module is made on (A) 6"×6" (or similar size as crystal silicon standards change) glass or other transparent substrate, or on (B) 6"×6" non-glass opaque or metal substrate. A manufacturing process has been disclosed in the above-referenced prior disclosures.

A key is to be able to use standard multi-wafer silicon crystal module manufacturing and handling equipment with minimal modifications. This would substantially reduce the equipment costs for III-V microwire solar cell modules.

An additional benefit is the yield rate will be much higher than making a much larger module than 6"×6", which most current thin-film solar cell manufacturers do. For example, Applied Material's thin-film module was recently increased from 1.4 square meters to 5.7 square meters, which is respective equivalent to 60 to 245 times the size of 6"×6" modules. For example, if the yield of a 6"×6" module is 95%, then 1.4 and 5.7 square meter modules would have respective yield of (0.95)60=4.6% and (0.95)245=0.0003%. The yield is a very important cost factor, especially during the early years of the manufacturing ramp up period.

A method of forming solar energy conversion devices with III-V photo voltaic nanowires formed on <111> crystalline silicon substrates will now be described, according to some embodiments. The embodiments are related to the teachings of WO2011/025733A1, which is incorporated by reference herein in its entirety, and is more particularly directed to III-V photovoltaic (PV) nanowire-based solar energy conversion devices. Generally speaking, the many examples set forth in WO2011/025733A1 for the growth of PV nanowires and the formation of operable photovoltaic solar panels therefrom, including methods for PV nanowire stabilization and forming operable electrode structures suitable for field use, are applicable for contexts in which the III-V PV nanowires are formed upon substrates whose surfaces exhibit long range atomic order, such as bulk crystalline wafer substrates. According to one embodiment, it is desirable to leverage the many teachings set forth in WO2011/025733A1 for PV nanowire-based solar cell formation for a particular context in which III-V PV nanowires are grown on a highly n-type (or p-type) doped <111> crystallographic plane of a silicon wafer.

One way is to grow the PV nanowires using gold catalyst on a highly n-type doped silicon's<111> crystallographic plane of the silicon wafer. The surface could optionally buffed, reactive etched, or slightly mechanically roughened to promote the initiation of growth. Since the growth is on same crystallographic plane, the nanowires will grow more parallel to each another, which is different from the more random orientation on growing on non-crystalline surfaces covered with a layer of amorphous silicon. The growth process could still be similar to that we disclosed for growing on non-crystalline surfaces, using MOCVD for example. After growth, we can do the same atomic layer deposition passivation, fill and etch back, and deposition of p-type Si, TCL, etc. at taught in WO2011/025733A1. Alternatively, we could also dope both ends of the nanowires, p-type and n-type, as we have disclosed before in the commonly assigned U.S. 61/381,930, supra.

Each of the following references discusses one or more aspects of growing III-V nanowires on crystalline silicon <111> substrates, and each of the following references is incorporated by reference herein in its entirety: Bao, X., et. al., "Heteroepitaxial Growth of Vertical GaAs Nanowires on Si (111) Substrates by Metal Organic Chemical Vapor Deposition," Nano Lett. 8 (11), 3755-3760 (2008); and Mi, Z., et. al., "III-V Compound Semiconductor Nanostructures On Silicon: Epitaxial Growth, Properties, And Applications In Light Emitting Diodes And Lasers," J. Nanophotonics, Vol. 3, 031602 (23 Jan. 2009). According to one preferred embodiment, it is desirable to form the PV nanowires such that the i-region of each nanowire is at least 0.2 μm in length.

Certain cost advantages associated with using SRAO substrates (e.g., compatibility with roll-based processes, etc.) are not shared for the currently disclosed embodiment of using silicon wafers as substrates for growing the III-V PV nanowires, and therefore the costs may be higher in comparison to growing on non-crystalline surfaces. However, since the III-V nanowire PV cell described herein inherently has much higher conversion efficiency than crystalline silicon, the resultant cost per watt will still be lower than conventional photovoltaic cells made of crystalline silicon.

Methods for fabricating nanowire-based photovoltaic solar cells on roller-based substrate material will now be described, according to some embodiments. According to some embodiments, high-efficiency solar cells are fabricated on a continuous substrate, such as a roll-to-roll based substrate. According to some embodiments crystallized III-V based solar cells are fabricated on a flexible substrate, such as roll-to-roll based substrates. According to some embodiments, PV nanowire-based solar cells are fabricated on a continuous substrate, such as a roll-to-roll based substrate. According to some embodiments, single crystalline nanostructure-based solar cells are fabricated on a continuous substrate, such as a roll-to-roll based substrate.

Aspects of the currently disclosed embodiments may be more thoroughly understood in view of the following references, each of which is incorporated by reference herein in its entirety: {19} Goto, et. al., "Growth of Core-Shell InP Nanowires for Photovoltaic Application by Selective-Area Metal Organic Vapor Phase Epitaxy," Applied Physics Express 2, 035004-1-3 (2009); {20} U.S. Pat. No. 7,608,530; {21} PCT International Patent Application No. PCT/US10/46334; {22} U.S. Pat. No. 7,608,530, issued Oct. 27, 2009 to Kobayashi and Wang, entitled "Hetero-Crystalline Structure and Method of Making Same"; {23} Singh and Hartnagel, "Reduction in Surface Charge Density By New GaAs Passivation Method," J. Phys. D: Appl. Phys., Vol. 8, pp. L42-L43 (1975); and {24} Pern and Glick, "Accelerated Exposure Tests of Encapsulated Si Solar Cells and Encapsulation Materials," National Center for Photovoltaics Program Review Meeting, Denver, Colo., Sep. 8-11, 1998, NREL/CP-520-25361 (October 1998).

Figure 4:
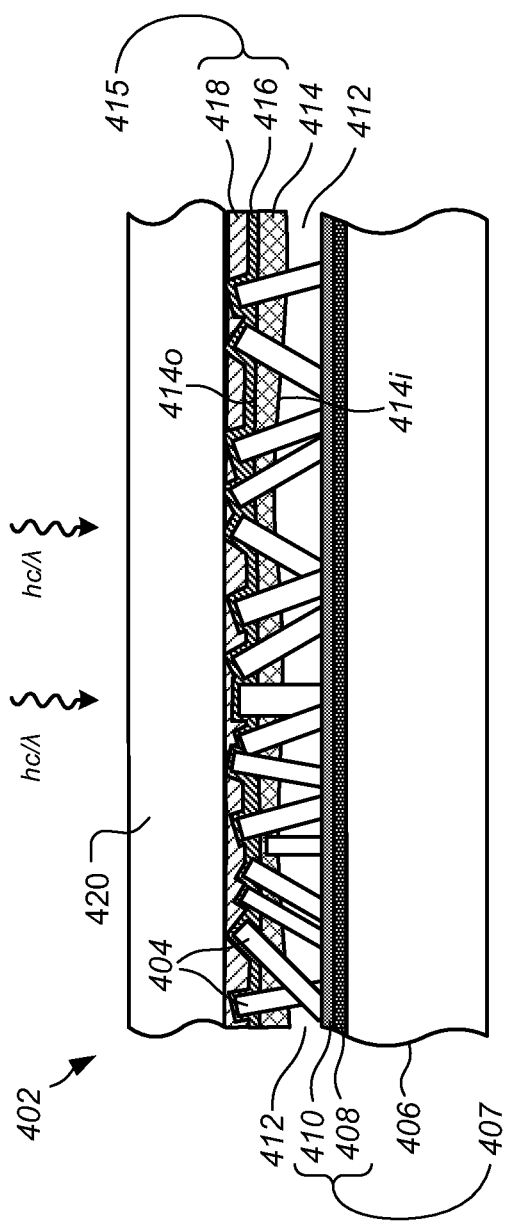
FIG. 4 illustrates a cross-sectional view of a PV nanowire-based solar cell, according to some embodiments.

FIG. 4 illustrates a cross-sectional view of a PV nanowire-based solar cell, according to some embodiments. PV nanowire-based solar cell 402 (PV nanowire-based photovoltaic energy conversion device) includes an array of PV nanowires 404. More specifically, for a preferred embodiment of FIG. 4, the array of PV nanowires 404 is sandwiched between a root-side electrode 407 and a tip-side electrode 415. The root-side electrode 407 includes an SRAO layer 410 (for example, n-type amorphous hydrogenated silicon or a-Si:H) and a metallic layer 408 (for example, molybdenum or aluminum). The root-side electrode 407 is disposed upon a continuous substrate 406, which according to some embodiment is stainless steel. According to some embodiments, substrate 406 is taken from a roll and cell 402 is manufactured on substrate 406 as part of a roll manufacturing process. According to some embodiments, the substrate 406 is electrically conductive, and can be considered as part of the root-side electrode. Tip-side electrode 415 comprises a layer 416 of an optically transparent electrically conductive material, such as an optically transparent electrically conductive semiconductor material including p-type a-Si:H, and a transparent conductive layer (TCL) 418. Although the PV nanowires 404 are shown as having rectangular cross-sections, they can likewise have a nanoneedle character, without departing from the scope of the preferred embodiments. According to some embodiments, a solid layer 414 of transparent insulating filler material is disposed in the space between the root-side electrode 407 and tip-side electrode 415, but it does not fill all of the air space among the PV nanowires 404, whereby there is an air gap layer 412 disposed between an inwardly facing surface 414i of the solid filler layer 414 and the root-side electrode 407. The tip ends of the PV nanowires 404 jut outwardly beyond an outwardly facing surface 414o of the solid filler layer 414 into physical and electrical contact with the tip-side electrode layer 415.

The design of FIG. 4 can be advantageous in reducing the adverse effects, such as absorption, heating, and darkening over time, that would be brought about by an insulator material that fully extends over the lengths of the PV nanowires, while at the same time providing good lateral stabilization of the PV nanowires and providing a stable platform upon which to fabricate the tip-side electrode layers of the device. Additionally, by the juttable extension of the tip ends of the PV nanowires 404 beyond the outwardly facing surface 414o of the solid filler layer 414 and well into the material of the tip-side electrode layer 415, superior electrical contact with the tip-side electrode layer 415 is achieved for promoting superior overall performance.

According to some embodiments, the air gap 412 occupies at least twenty-five percent of the vertical space between the solid filler layer 414 and the root-side electrode 407. For another preferred embodiment, the air gap 412 occupies at least fifty percent of the vertical space between the solid filler layer 414 and the root-side electrode 407. For another preferred embodiment, the air gap 412 occupies at least seventy-five percent of the vertical space between the solid filler layer 414 and the root-side electrode 407. Notably, in view of the material characteristics of the solid filler layer 414 (optically transparent, electrically insulating), it is not required that the air gap 412 be provided over one hundred percent of the lateral extent of the root-side electrode 407, because the device would still be substantially operable in the event there is contact between portions of the solid filler layer 414, although the advantages of the air gap would not be enjoyed at those contact locations. Accordingly, some drooping or sagging of the solid filler layer 414 toward the root-side electrode 407 as may occur during device fabrication, including some areas of contact therebetween that are not statistically overwhelming relative to the overall lateral extent of the device, may be acceptable.

According to some embodiments, each of the PV nanowires 404 is intrinsically doped along all or substantially all of its length between the root-side electrode 407 and tip-side electrode 415, with a photovoltaic cell being formed by virtue of the p-doped layer 416 at the tip end and the n-doped layer 410 at the root end. For this preferred embodiment the nanowire array 404 acts as the i-region, that is, each PV nanowire 404 is an i-region along its entire length. As used herein, i-region refers to a semiconductor region that is an intrinsically doped semiconductor region, or a semiconductor region that is not intentionally doped, as contrasted with p-region or p-doped region (intentionally p-doped) and n-region or n-doped region (intentionally n-doped). According to some other embodiments, the tips of the PV nanowires 404 can be doped of a similar type as the corresponding electrode. For embodiments having an opaque substrate 406 such as in FIGS. 4-5, the light photons enter the device from the top (tip-side) through the transparent conductive layer (TCL) 418, then through the thin (10 to 20 nm) transparent p-type electrode layer 416, and then to the array of PV nanowires 404. TCL 418 can comprise a transparent conductive oxide, such as ITO (indium tin oxide), or alternatively any of a variety of different materials known to be both conductive and transparent, preferably with more than 80% light transmission. It is to be appreciated that it is within the scope of the preferred embodiments for the described doping configurations to be reversed, for example, for the p-type electrode layer (and p-type nanowire tips) to be at the root side of the device of FIG. 4 and n-type electrode layer (and n-type nanowire tips) to be near the tip side of the device. According to some embodiments, the cell 402 includes a protective glass layer 420 on top (i.e., on the tip-side of the PV nanowire-based solar cell device).

Figure 5:
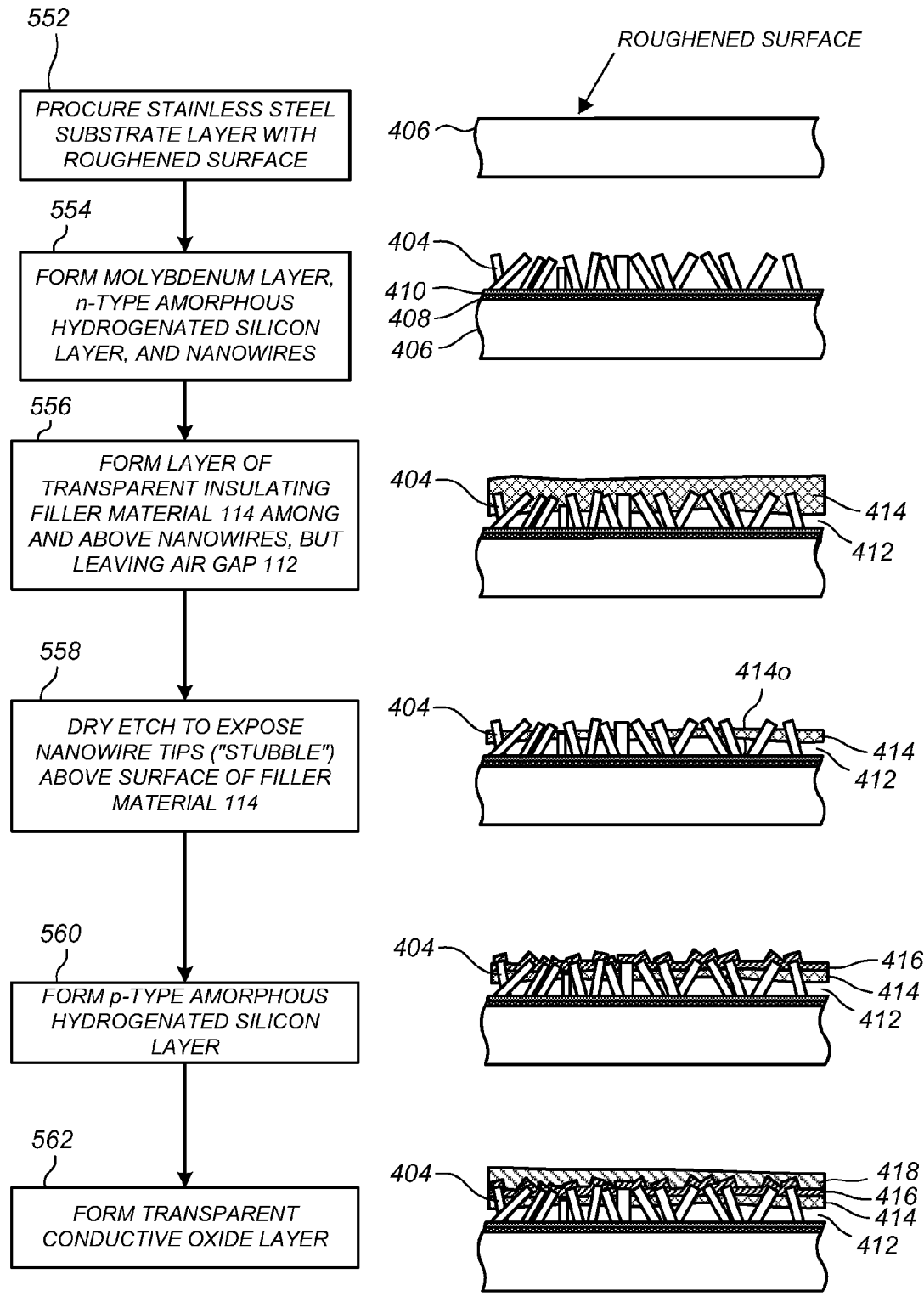
FIG. 5 illustrates some fabrication steps of the device of FIG. 4 according to some embodiments.

FIG. 5 illustrates some fabrication steps of the device of FIG. 4 according to some embodiments. According to these embodiments stainless steel substrate 506 in a continuous form such as a roll is used. At step 552, the stainless steel surface can be textured or roughened, which will increase light trapping by allowing the incident light photons to back-reflect. When the PV nanowires to be grown will have high aspect ratios (greater than 20:1, for example), they will generally be naturally light trapping and so the texturing of the substrate may be less beneficial. However, when the PV nanowires to be grown will be short and stubby according to some embodiments (less than 20:1, for example), they may be less naturally light-trapping and therefore it will be more beneficial to texturize the stainless steel surface as in step 552.

At step 554, the stainless steel surface is sputtered or evaporation coated with a layer of metal 408 such as molybdenum or aluminum or other metals, the layer 408 thus also facilitates bottom electrode (root-side electrode) functionality in conjunction with the n-type electrode layer 410. The metal layer 408, on the textured substrate surface, could also reflect back into the nanowire array any transmitted photons. Also at step 554, the electrode layer 410 of n-type a-Si:H is deposited, for example by PECVD (plasma enhanced chemical vapor deposition). Also at step 554, the PV nanowires 404 are grown, such as by MOCVD (metal organic chemical vapor deposition) or CVD (chemical vapor deposition) outwardly from the electrode layer 410 with or without the need of catalysts, using for example one or more techniques discussed in U.S. Pat. No. 7,608,530. The nanowires grown by such technique could allow for the design of PV nanowire arrays with better geometry. According to some embodiments, the PV nanowires 404 should have a diameter in the range of 100 to 500 nm. Broader ranges, such as 20 to 1000 nm are also usable. One particularly important feature is the cross-sectional aspect ratio of the PV nanowires 404 (ratio of length to root cross-sectional dimension). For better performance, lower aspect ratios are more desirable, preferably in the range of 1:1 to 20:1, which is in contrast to known prior art PV nanowire aspect ratios that are much larger than 20:1.

At steps 556-558, the layer 414 of optically transparent, electrically insulating solid filler material is formed that laterally surrounds the PV nanowires 404 along a portion of their lengths, wherein the forming is carried out such that (i) the air gap 412 remains between the root-side electrode 407 and an inwardly facing surface 414i of the solid filler layer 414, and (ii) the tip ends of the PV nanowires 104 are juttedly exposed beyond an outwardly facing surface 414o of the solid filler layer 414. At step 556, the optically transparent, electrically insulating solid filler material is applied, such as by spaying or injecting via inkjet. For one preferred embodiment, the filler material comprises a spray-coating material, such as spray-on glass, that is applied to the top of the PV nanowire array via one or more sprayer heads.

Note that according to some preferred embodiments, the filler material is sprayed on such that the air gap 412 remains. At step 558, the solid filler layer 414 is subject to a dry etch, such as with $O_2$ plasma, so that most of the PV nanowires 404 jut outwardly from the outward surface 414o of the solid filler layer 414 and are available to make good physical and electrical contact with the tip-side electrode layer 415. Since the PV nanowires 404 are less affected by the etching, their tip ends look much like stubble or whiskers sticking out of the solid filler layer 414.

Notably, a variety of different materials for the solid filler layer 414 and methods for achieving the result of steps 556-558 are within the scope of the preferred embodiments. For example, the solid filler layer 414 can alternatively comprise one or more of Si oxides, Si nitrides, Al oxide, Al nitride, or other materials that are optically transparent and electrically insulating. According to some embodiments, the depth space between the PV nanowires is left partially unfilled, thereby leaving the air gap 412. In this way, the filler material will not absorb substantial amounts of the incident photons before reaching the i-region of the PV nanowires. An optically transparent, electrically insulating filler material that is somewhat phobic to the PV nanowires so that it does not "wet" well to the nanowires may be preferred. Advantageously, upon completion of step 558, the outwardly facing surface 414o of the solid filler layer 414 is available as a stable platform for the formation of the tip-side electrode layers 416 and 418. As used herein, the term "layer" should not be construed as limiting such item to a single material, but rather a layer recited herein such as the solid filler layer 414, the passivation layer 656 (in FIG. 6), root-side electrode layer 407, or tip-side electrode layer 415 can comprise multiple sublayers of different materials.

At step 560, for this preferred embodiment, a p-type layer 416 of amorphous Si:H is deposited on the outwardly facing surface 414o of the solid filler layer 414 by a PECVD process. Finally, at step 562, the TCL 418 (transparent conductive layer) is deposited. There are a number of well-known materials that can be used for the TCL 418 that are suitable in photovoltaic cells, such as SnO (tin oxide), indium-tin oxides (ITO), ZnO, etc., as well as non-oxide materials that are substantially conductive and substantially transparent.

In another preferred embodiment as will be discussed further infra, before forming the solid filler layer 414, an atomic layer of Si oxide or Al oxide is deposited onto the nanowires to coat the PV nanowires using atomic layer deposition method for passivating the surfaces of the PV nanowires and increasing overall efficiency.

Presented by way of example, and not by way of limitation, are typical dimensions and materials for the various layers of the PV nanowire-based solar cell 402 of FIG. 4. The metal layer 408 will typically be greater than 100 nm thick and comprise a metal and/or metallic alloy such as Mo, Cr, NiSi, etc. The n-electrode layer 410 will typically be n-type a-Si:H (B doped a-Si—H, etc.) having a thickness greater than 50 nm. The PV nanowires 404, which have the preferred dimensions and aspect ratios described supra, can comprise Group IV, II-VI, or III-V semiconductors and related alloys. For one preferred embodiment, the nanowires 404 will have lengths and diameters of about 10 nm or greater, again so as preferably to keep their aspect ratios low to make their surface area to volume ratios low. The p-electrode layer 416 will typically have a thickness greater than 10 nm and may comprise wide bandgap non-single-crystal semiconductors such as p-type a-Si:H, p-type mc-Si:H, p-type SiC, etc. The TCL 418 will typically have a thickness greater than about 500 nm and will preferably comprise a wide bandgap transparent semiconductor (ITO, ZNO, etc.). The PV nanowire-based solar cell 402 will also comprise a mesh-style electrode layer (not shown in FIG. 4) atop the TCL 418, the mesh-style electrode layer being optimally designed to provide electrical connectivity to the various areas of TCL 418, while at the same time not covering too much lateral area so as to allow most of the incident light to pass through to the TCL 418 and the underlying layers.

Figure 6:
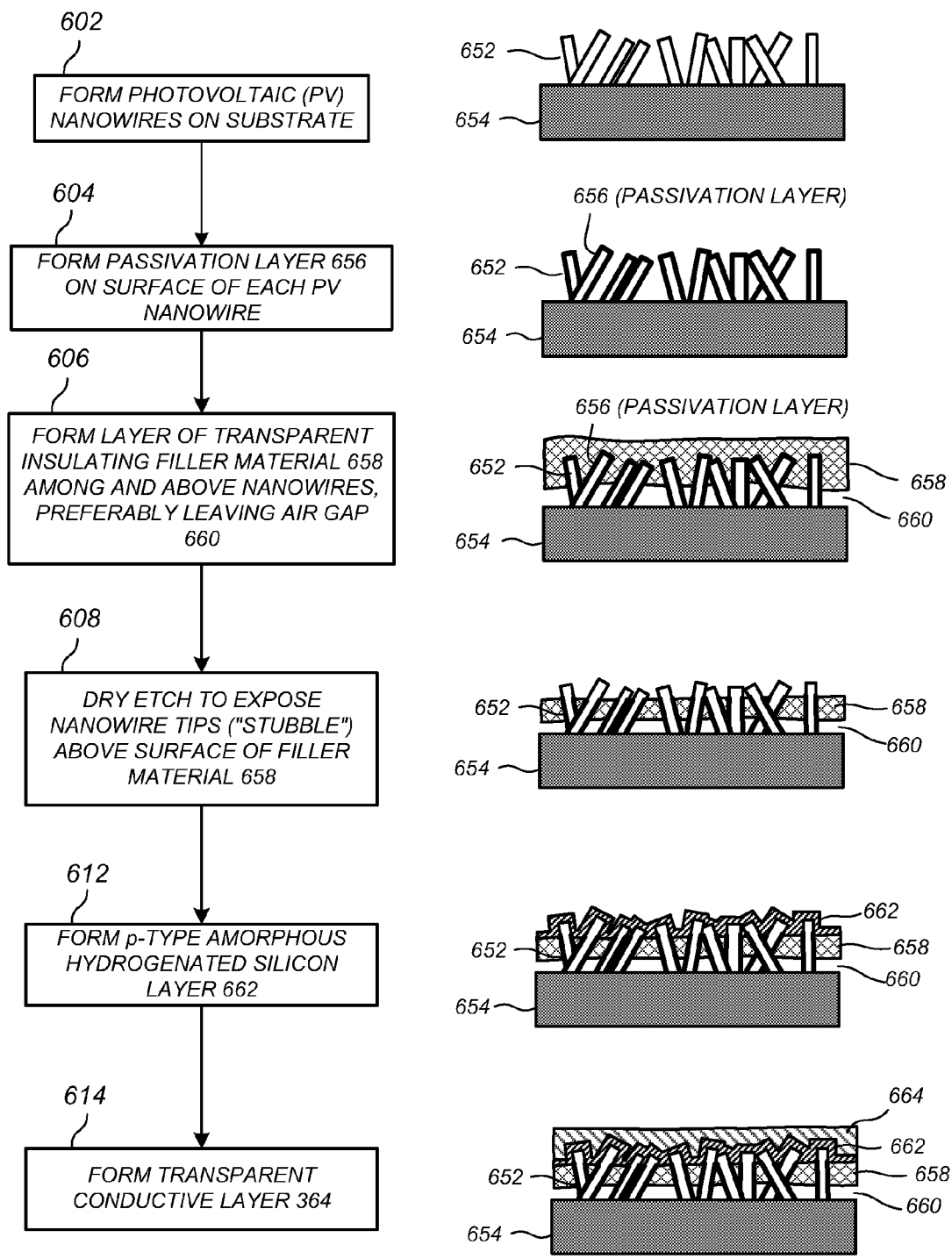
FIG. 6 illustrates fabrication of a PV nanowire-based solar cell according to some embodiments.

FIG. 6 illustrates fabrication of a PV nanowire-based solar cell according to some embodiments. At step 602, PV nanowires 652 are formed upon a continuous substrate 654, such as stainless steel from a roll source. The substrate 654 includes a root-side electrode structure (not shown) including an SRAO surface (not shown) similar to those described above from which the PV nanowires 652 are grown, these elements being omitted from the present description for clarity of disclosure. PV nanowires amenable to passivation methods according to one or more of the preferred embodiments can be formed upon substrates that exhibit long-range atomic order, substrates having SRAO material surfaces, or other suitable substrates.

At step 604, the PV nanowires 652 are passivated by forming a passivation layer 656 (which may itself comprise multiple individual passivation layers) on each individual PV nanowire 652. The passivation layer 656 can be formed using methods including, but not limited to, atomic layer deposition. Atomic layer deposition can be particularly advantageous for randomly oriented ensembles of nanowires with high aspect ratio for which conventional chemical vapor deposition may not be sufficiently functional. Atomic layer deposition will provide conformal deposition that uniformly covers complicated geometrical surfaces resulting from randomly oriented ensembles of nanowires. Suitable materials for the passivation layer 656 include, but are not limited to, aluminum oxide, tin oxide, titanium oxide, silicon oxide and certain nitrides. In one preferred embodiment for which the PV nanowires 652 are formed from InP material, the passivation process comprises depositing a thin layer of $SiO_2$ on the PV nanowires 652 by placing the assembly in an atomic layer deposition reactor and introducing two precursors containing silicon and oxygen that react spontaneously even at room temperature. Prior to the deposition of a passivation layer, the surfaces of the PV nanowires 652 could be chemically pretreated to saturate dangling bonds on the surface. For instance, a process that employs chemicals that contain sulfur using ammonium sulfide was found very effective way to reduce adverse surface effects as described in Iyer, R., "Sulfur as a Surface Passivation for InP," Appl. Phys. Lett. 53 (2) (1988), which is incorporated by reference herein in its entirety. However, an ensemble of nanowires is inherently hydrophobic, thus a surface treatment based on solution will not work as uniformly on all nanowires within an ensemble. Instead, it is more preferable to place a small amount of solid sulfur in atomic layer deposition reaction chamber during the deposition of a passivation layer. The sulfur pretreatment process serves to protect, or at least stabilize, the surface of the PV nanowires 652 against thermal degradation during the deposition of a passivation layer.

Subsequent to the passivation of the PV nanowires 552 at step 604, the remainder of the solar cell fabrication process can proceed according to one or more methods described above with respect to FIG. 5. The remainder of steps of FIG. 6 are similar to the latter steps of the fabrication method of FIG. 5 that results in the device of FIG. 4. At step 606, a layer of substantially transparent insulating filler material 658 is applied, preferably in a manner that leaves an air gap 660. At step 608, the filler layer 658 is subject to a dry etch, such as with $O_2$ plasma. Since the PV nanowires 652 are less affected by the dry etch, the appearance is much like whiskers sticking out of the transparent insulating filler 658. Advantageously, a significant longitudinal portion of the PV nanowires 652 are now available to make electrical contact with the top layers, rather than just the top tips of the PV nanowires. In addition to etching back the filler material 658, the dry etch step 608 should also serve to etch back the passivation layer 656 above the surface of the filler material 658 so to expose the tips and upper sidewalls of the PV nanowires 652, to facilitate electrical contact with the subsequently applied p-type layer of amorphous Si:H. At step 612, the p-type layer 662 of amorphous Si:H is deposited on the filler layer by PECVD process. Advantageously, by virtue of the etching step 608, a better ohmic contact is established between each PV nanowire 652 and the a-Si:H layer 662, since the a-Si:H layer 662 now can make substantial contact with the upper side walls of the PV nanowires 652 rather than just the very tips of the PV nanowires 652. Finally, at step 614, a transparent conductive layer 664 (e.g., comprising tin oxide, indium-tin oxides, zinc oxide, or other substantially conductive and substantially transparent material) is formed above the Si:H layer 662.

Conventional uses of a passivation layer on a semiconductor surface is rather passive in the sense that electronic states associated with the presence of a surface are inactivated so that they do not contribute to the electrical transport properties of bulk semiconductor underneath the surface. In contrast, within our frame work of passivation of PV nanowires, we explicitly control the electrical transport properties of PV nanowires by tuning the electronic structures established between a passivation layer and a semiconductor surface.

Explicit control of the electronic structures can be established between a passivation layer and a semiconductor surface by controlling, for instance, bandgap of a passivation layer or the density of built-in ionized impurities in a passivation layer, which can be very advantageous for PV nanowires. Unlike a semiconductor surface that exists on a bulk semiconductor that has infinite thickness, the diameter of a nanowire is very small, thus an electronic band that deforms at the surface of a nanowire can be interacted inside of a nanowire. As a result, photo-generated excess electron and holes can be confined either near the center of a nanowire or near the surface of a nanowire. The band bending at the surface of a nanowire can be intentionally controlled by, for instance, having a passivation layer contain either negatively or positively charged ions.

In the PV structure that employs PV nanowires described hereinabove, all nanowires in an ensemble of nanowires have a built-in electric field parallel to the long axis of nanowires, thus, charged carriers confined near the center of a nanowire can be swept away by drift without getting scattered at the surface of a nanowire while charged carriers confined near the surface of a nanowire will be swept away by drift in quasi-two dimensional channel (i.e., two-dimensional electron or hole gas), which improves overall PV properties.

The term "micro-wires" or "microwires" can be used to refer to the PV nanowires 652 where their root dimensions approach the order of hundreds of nanometers.

Figure 7:
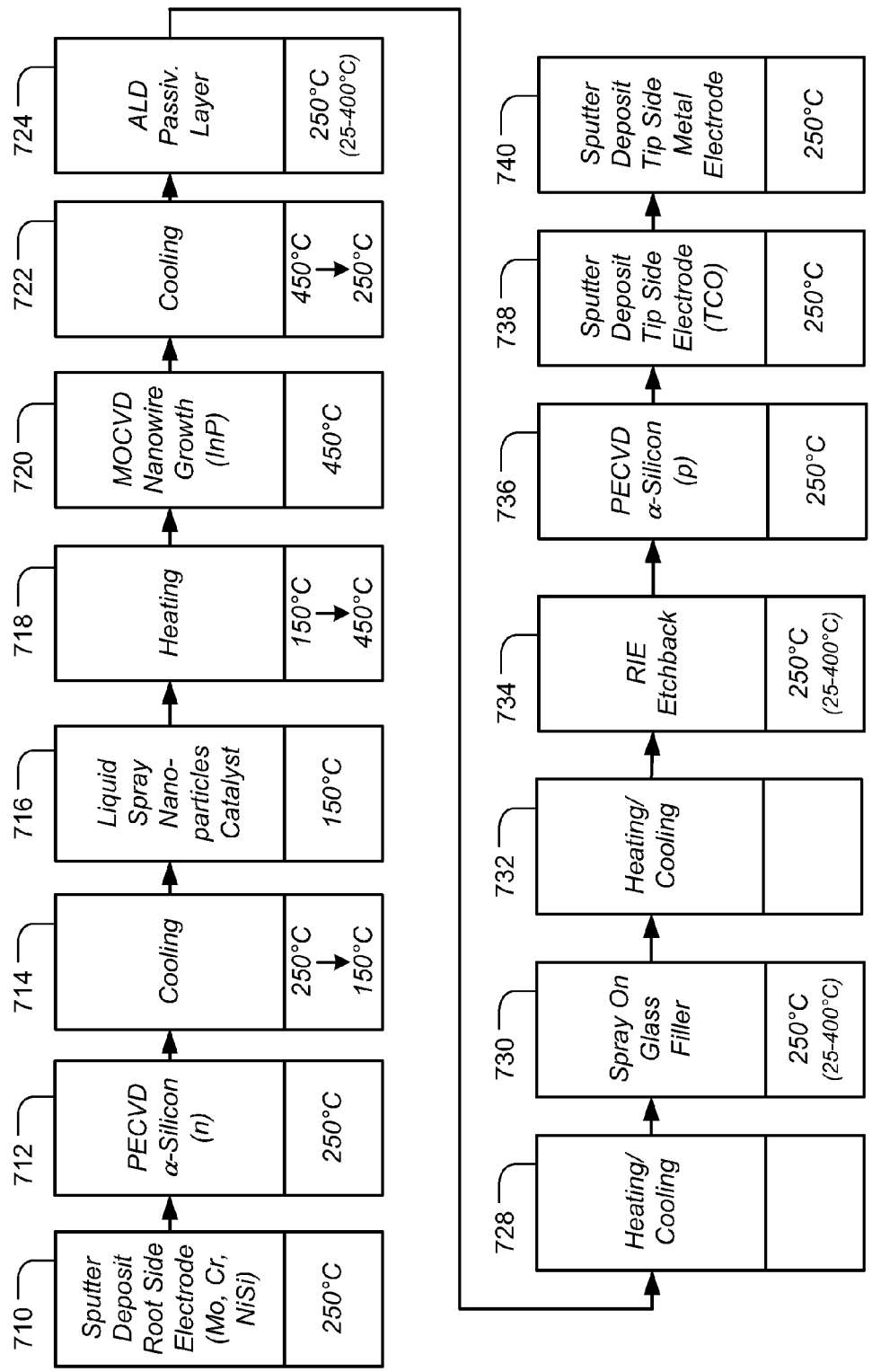
FIG. 7 is a block diagram showing stations of a continuous substrate roll manufacturing process for fabricating PV nanowire-based solar cells, according to some embodiments.

FIG. 7 is a block diagram showing stations of a continuous substrate roll manufacturing process for fabricating PV nanowire-based solar cells, according to some embodiments. According to some embodiments, each station has the same length and the process is carried out at each station while the substrate is stationary. Following a set amount of time, for example 5 minutes, the processes at each station are complete and the substrate is advanced and stopped such that the portion of substrate that was processed by the previous station is aligned for processing at the following station. Through this start-stop process of indexed advancements, the PV nanowire based solar cells are fabricated on a continuous substrate such as rolled stainless steel.

At station 710, the root side electrode is deposited. Station 710 corresponds to part of step 554 in FIG. 5 in which a layer of metal such as molybdenum or aluminum or other metals form a part or all of the root side electrode. According to some embodiments, the processing temperature is about 250° C. Prior to station 710, a pre-heating station may be used to raise the temperature from room temperature to close to 250° C. At station 712 an amorphous silicon, for example n-type, is formed via a PECVD process at approximately 250° C., which also corresponds to part of step 554 in FIG. 5.

At station 714, the substrate is actively cooled in preparation for the application of micro-particles used as a catalyst for nanowire growth. The active cooling can be, for example, by convection with a gas such as helium gas and/or conduction such as with cooling rollers as will be described in further detail herein. At station 716, a catalyst material such as gold or titanium is deposited at a large number of spots, with each spot being a location at which a nanowire will be grown. According to some embodiments, gold suspended in a suitable organic solvent is sprayed on the substrate so as to uniformly distribute the nano particles of gold. According to some embodiments, the spray on catalyst can be performed at about 150° C. At station 718, the substrate is heated in preparation for the nanowire growth process. Heating can be carried out, for example using convection, conduction via heated rollers as is described in further detail herein and/or radiation such as with IR lamps as is known in rapid thermal annealing processes.

At station 720, the nanowires are grown at temperatures of about 450° C. Station 720 corresponds with part of step 554 in FIG. 5 and with step 602 in FIG. 6. Precursor gases, including the elements or compounds that will form the nanowires, are introduced into a chamber. Under the influence of the catalyst, the precursor gases at least partially decompose into their respective elements, some of which are transported on or through the catalyst in liquified phase to the immediately underlying solid surface provided by the substrate. At each spot, a nanowire epitaxially grows outwardly from the substrate as the process proceeds, the catalyst at each spot remaining at the tip of the nanowire and rising away from surface of the substrate as the nanowire grows. The resultant nanowires exhibit a long-range atomic order (i.e., single-crystal) that can potentially be exploited for a variety of different useful applications.

By way of example, the VLS synthesis process can be carried out in a metalorganic chemical vapor deposition (MOCVD) process, which is sometimes alternatively termed a metalorganic vapor phase epitaxy (MOVPE) process, an organometallic vapor phase epitaxy (OMVPE) process, or an organometallic chemical vapor deposition (OMCVD) process. Exemplary precursors for InP nanowires can be trimethylindium (($CH_3)_3$In) and phosphine ($PH_3$). During a first phase of nanowire growth corresponding to the root region, n-type doping can be achieved during the MOCVD process by introducing an Si-containing gas, such as silane ($SiH_4$), or other suitable n-dopant. During a second phase of nanowire growth corresponding to the intrinsic region, no dopants would be introduced. During a third root region phase of nanowire growth corresponding to the tip region, p-type doping can be achieved during the MOCVD process by introducing a metalorganic vapor containing Zn, or other p-type dopants such as Be in a Be-containing metalorganic vapor. In other preferred embodiments, the PV nanowires can comprise another III-V material such as GaAs, together with suitable associated complementary dopants for the root and tip ends.

A variety of different material systems and doping schemes for the PV nanowires are generally within the scope of the preferred embodiments. According to some embodiments, the root ends of the PV nanowires correspond to the n-doped side of the device, while the tip ends correspond to the p-doped side of the device.

It has been found particularly advantageous for the PV nanowires to comprise high-purity intrinsic InP along most or all of their vertical height (length). Thus, according to some embodiments, in which these InP nanowires have root diameters in the range of 400 nm-750 nm, aspect ratios in the range of 2.0-5.0, and therefore nanowire lengths in the range of 0.8 µm-3.75 µm, high-purity intrinsic InP extends along most or all of the 0.8 µm-3.75 µm length of the nanowire. The photovoltaic character of the overall device is provided by virtue of the tip-side p-i junctions formed with the p-doped a-Si:H layer at the tip end, and the root-side i-n junctions formed with the n-doped a-Si:H layer at the root end.

At station 722, the substrate is actively cooled in preparation for the application of the passivation layer. The active cooling can be, for example, by convection with a gas such as helium gas and/or conduction such as with cooling rollers as will be described in further detail herein. At station 724, a passivation layer of a material such as aluminum oxide, tin oxide, titanium oxide, silicon oxide or other nitride is applied via atomic layer deposition. The passivation layer can be deposited, using atomic layer deposition at range of temperatures from about room temperature to about 400° C. According to some embodiments a temperature of about 250° C. so as to minimize the need to heat and/or cool the substrate in subsequent processing steps. Station 724 corresponds with step 604 in FIG. 6.

At station 728, the substrate is heated or cooled in preparation for the application of the filler layer. At station 730, the filler material is applied preferably using a spray-coating material, such as spray-on glass. The filler material is uniformly applied to the top of the PV nanowire array via one or more sprayer heads in station 730. Station 730 corresponds to step 556 in FIG. 5 and to step 606 in FIG. 6. The liquid used in station 730 can be similar or identical to known spin-on glass formulations. However, due to the highly viscous nature of many such liquids, a higher application temperature is preferred when spraying on rather than spinning on the glass. According to some embodiments, filler material may be applied at a temperature of about 250° C. so as to lower the viscosity of the filler material and also to minimize the need to heat and/or cool the substrate in subsequent processing steps. At station 732, the substrate is heated or cooled in preparation for the etching step. Note that in the case where stations 724, 730 and 734 are all carried out at close to 250° C., the additional heating/cooling stations 728 and 732 can be eliminated. At station 734, the filler layer is subject to a dry etch, such as with O2 plasma, at approximately 250° C. Station 734 corresponds to step 558 in FIG. 5 and to step 608 in FIG. 6.

At station 736, a p-type layer of amorphous Si:H is deposited on the solid filler layer by a PECVD process at approximately 250° C. Station 736 corresponds to step 560 in FIG. 5 and to step 612 in FIG. 6. At station 738, the TCL (transparent conductive layer) is deposited at approximately 250° C. There are a number of well-known materials that can be used for the TCL that are suitable in photovoltaic cells, such as SnO (tin oxide), indium-tin oxides (ITO), ZnO, etc., as well as non-oxide materials that are substantially conductive and substantially transparent. Station 738 corresponds to step 562 in FIG. 5 and to step 614 in FIG. 6. At station 740, a metal layer is sputter deposited to create one or more metal electrodes on the tip side. Since the metal electrode will block light from entering the cell, the shape of the metal should be designed, such as a grid-pattern, so as to minimize the amount of surface area covered.

Figure 8A:
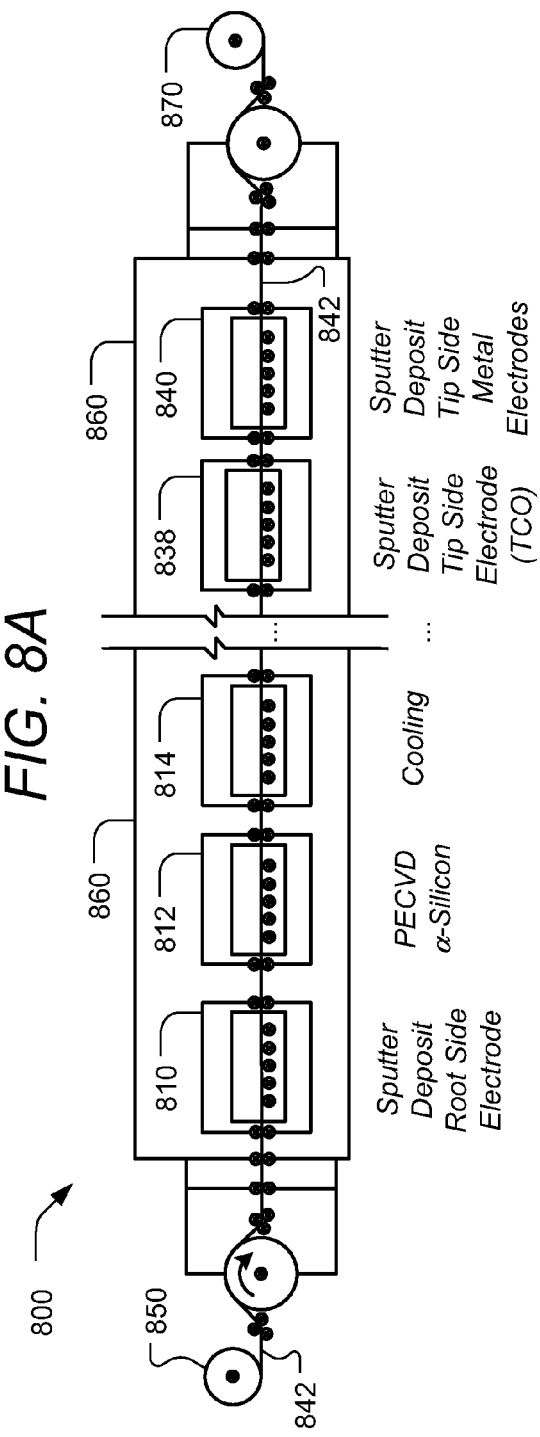
FIGS. 8A-B schematically illustrate roll-based continuous substrate manufacturing processes for PV nanowire-based solar cells, according to some embodiments.
Figure 8B:
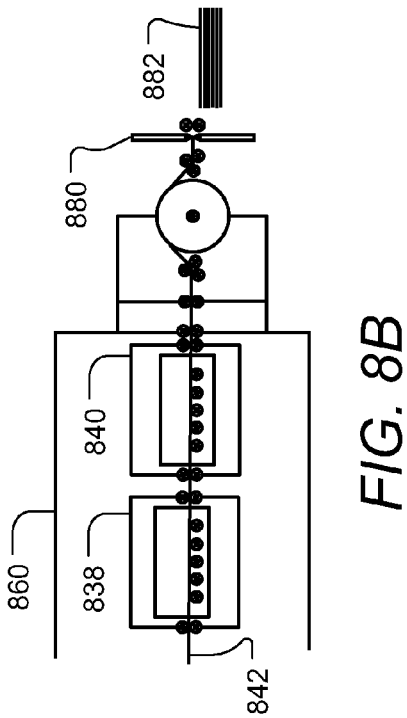

FIGS. 8A-B schematically illustrate roll-based continuous substrate manufacturing processes for PV nanowire-based solar cells, according to some embodiments. In FIG. 8A, the roll-based fabrication line 800 is shown that includes a large continuous substrate 842 that passes through a number of processing stations such as those described with respect to FIG. 7. According to some embodiments, substrate 842 is thin stainless steel that is sourced from source roll 850. According to some embodiments substrate 842 is 1 meter wide and about 5 km long. According to some embodiments, each processing station processes about 1 square meter of substrate material in a stop-start fashion. The processing stations, such as stations 810, 812, 814, 838 and 840 are housed within respective housings to provide the environment (e.g. pressure, temperature and gasses) used for the particular process carried out at the station. For example, station 810, which corresponds to station 710 in FIG. 7, is used to sputter deposit the root side electrode layer at about 250° C.; station 812, which corresponds to station 712 in FIG. 7 is used to form an amorphous silicon layer via a PECVD process at approximately 250° C.; station 814, which corresponds to station 714 in FIG. 7 is used to actively cool the substrate 842 in preparation for the application of micro-particles used as a catalyst for the nanowire growth; station 538, which corresponds to station 738 in FIG. 7, is used deposit the TCL (transparent conductive layer) at approximately 250° C.; and in station 840, which corresponds to station 740 in FIG. 7, a metal layer is sputter deposited to create one or more metal electrodes.

In FIG. 8A, the fabricated solar cells are collected on a roll 870. In the case of FIG. 8B, the fabricated solar cells are cut using cutter 880 into sheets corresponding to the size of the processing stations. In the example of each processing station covering a 1 m×1 m are of the substrate 842, for example, the cut size of sheets 882 is also 1 m×1 m.

According to some embodiments, one or more buffer chambers 860 are used to collect any gases that may have leaked from the individual processing stations. The buffer chambers, such as buffer chamber 860, can be used to (1) recycle escaped gasses for subsequent use; and/or (2) collect gases for subsequent treatment to decrease the likelihood of a hazardous gas escaping into the environment. A number of rollers are provided at the entrances and exits of each processing station and to the buffer chamber(s) so as to provide sufficient impedance for gas leakage, and to prevent cross-contamination as will be described in further detail herein. The upper rollers are preferably made from a soft elastic material having low hardness so as not to damage the formed structures (e.g. the nanowires) during the fabrication process, and appropriate temperature resistance for the processes being carried out.

When operating in a start-stop processing arrangement, the stationary time allowed for processing at each station should be set according to the most time consuming process. In one example, the MOCVD nanowire growth station, such as station 720 in FIG. 7, is the most time consuming station and uses about 5 minutes. In this example, the substrate is advanced by 1 meter plus the distance between the stations and then stopped for 5 minutes, then advanced and then stopped for 5 minutes, and so on. In the case where fabrication line 800 uses a 1 meter wide substrate and 1 meter long processing stations, the throughput is approximately:

$$\frac{1 \text{ meter}^2}{5 \text{ min}} \times 60 \frac{\text{min}}{\text{hr}} \times 24 \frac{\text{hr}}{\text{day}} \times 365 \frac{\text{days}}{\text{year}} \cong 100{,}000 \text{ m}^2/\text{year}$$

Assuming in this example, 1 square meter generates about 200 watts for 20% efficiency at 1000 watts/square meter, such a line would produce about 20 Megawatts/Year. According to some embodiments, a wider substrate media could be used, such as 2 meters wide, and the processing stations could be 2 meters long, which would produce 4 square meters per 5 minutes equaling about 80 MW per year.

According to some embodiments, a continuous process could be used instead of a start-stop process.

Figure 9:
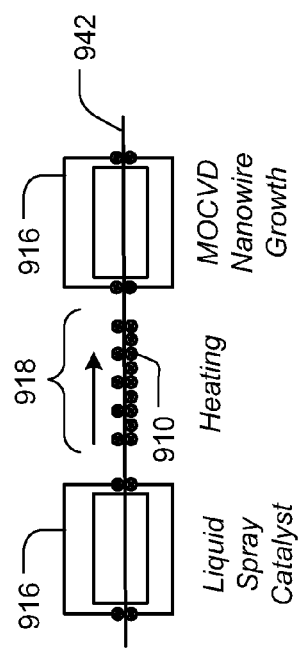
FIG. 9 is diagram schematically illustrating a heating and/or cooling station, according to some embodiments.

FIG. 9 is diagram schematically illustrating a heating and/or cooling station, according to some embodiments. In FIG. 9, a heating station 918 is used to raise the temperature of the substrate 942 from the liquid spray catalyst stage 916 to the MOCVD nanowire growth stage 920. According to these embodiments, heated rollers such as rollers 910 are used to heat the substrate using conduction. the rollers can be heated for example via electric resistance coils and/or by passing heated liquid through portions of the rollers. According to some embodiments, the same type of arrangement of rollers could be used for cooling the substrate 942 via conduction in which case the rollers are cooled for example by passing a cool liquid through portions thereof.

Figure 10A:
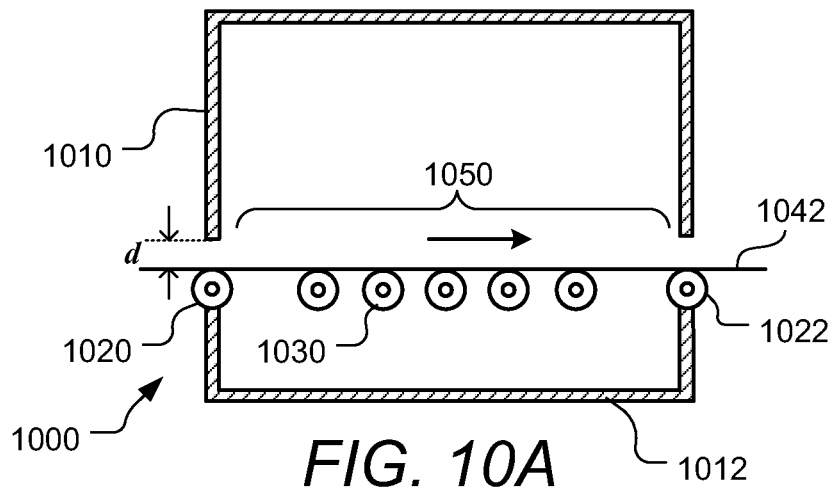
FIGS. 10A-B show cross sections of a processing chamber having a moveable lid, according to some embodiments.
Figure 10B:
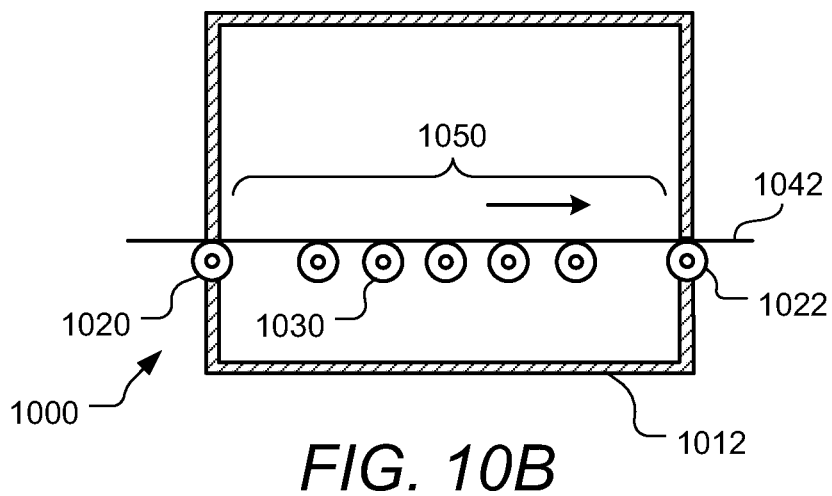

FIGS. 10A-B show cross sections of a processing chamber having a moveable lid, according to some embodiments. Processing station 1000 has an upper lid 1010 and a lower housing 1012. A start-stop process is used to fabricate PV nanowire-based solar cells on a continuous substrate 1042. The substrate 1042 is held flat in part by rollers within the chamber such as roller 1030. The portion of the substrate 1050 is where the solar cells are being fabricated. In between processing stages, when the substrate is being advanced, the moveable lid 1010 is raised by a distance d, as shown in FIG. 10A. During processing at station 1000, the lid 1010 is lowered to contact the substrate 1042 such that the processing chamber is relatively air tight between the walls of the lid 1010 and lower rollers 1020 and 1022. In this way, very little gas will escape from the chamber during processing. Prior to raising the lid 1010, the chamber can be flushed such that contaminating gases can be removed. Note that in a start-stop fabrication method, fabrication only takes place in some locations on the substrate, such as location 1050, so that contact by the wall portions of the lid 1010 will not damage any structures being fabricated.

Figure 11:
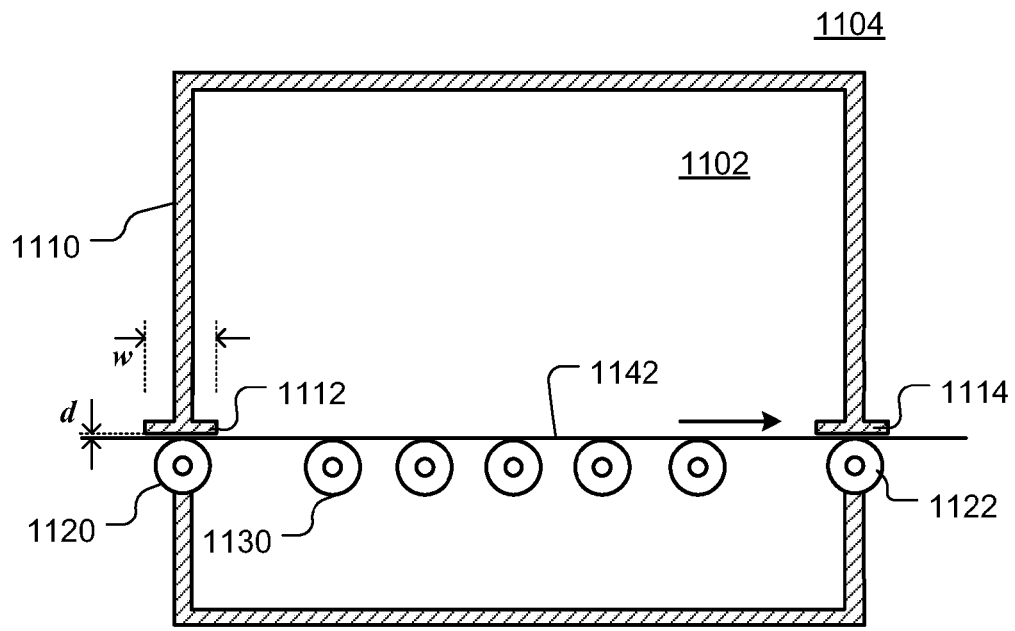
FIG. 11 is a cross section of a processing chamber having high impedance wall section, according to some embodiments.

FIG. 11 is a cross section of a processing chamber having high impedance wall section, according to some embodiments. Processing station 1100 has a wall 1110 that forms a processing chamber 1102 with slots on the left and right sides for entry and exit of a continuous substrate 1142 on which solar cells are fabricated. The substrate 1142 is held flat in part by rollers within the chamber such as roller 1130. Gas communication between the chamber 1102 and the outside 1104, which could be still within a buffer chamber, is controlled by contact rollers 1120 and 1122 and wall sections 1112 and 1114. Wall sections 1112 and 1114 have a width w and a distance d from the surface of the substrate 1142 such that there is sufficient impedance for gas communication between the chamber 1102 and the outside 1104. According to some embodiments, station 1100 is used in a start-stop fabrication process. However, according to some embodiments, station 1100 is used in a continuous processing method in which the substrate 1142 is continuously advanced without stopping.

Figure 12:
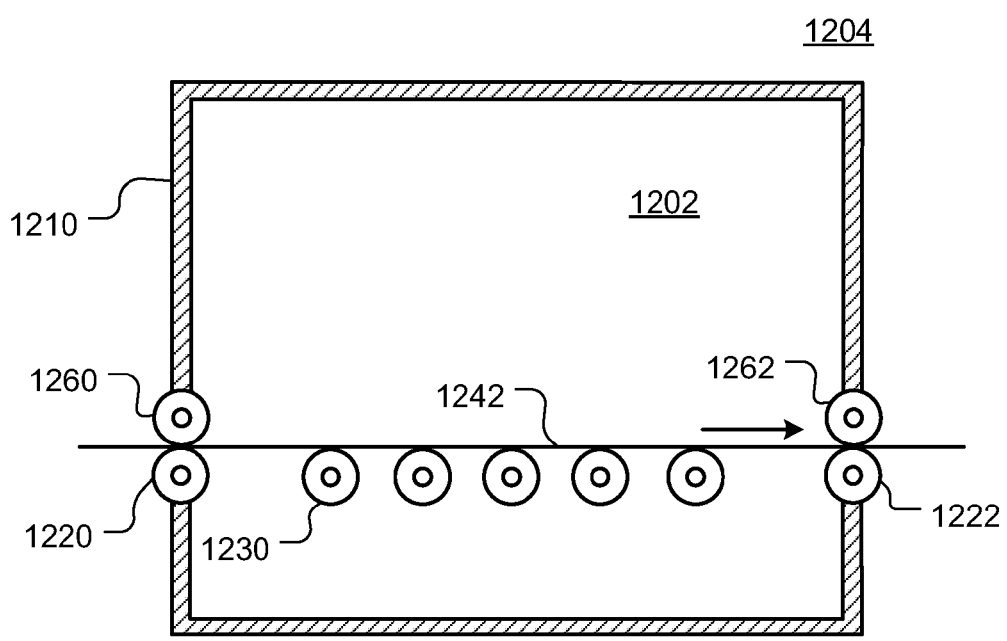
FIG. 12 is a cross section of a processing chamber having double rollers, according to some embodiments.

FIG. 12 is a cross section of a processing chamber having double rollers, according to some embodiments. Processing station 1200 has a wall 1210 that forms a processing chamber 1202 with slots on the left and right sides for entry and exit of a continuous substrate 1242 on which solar cells are fabricated. The substrate 1242 is held flat in part by rollers within the chamber such as roller 1230. Gas communication between the chamber 1202 and the outside 1204, which could be still within a buffer chamber, is controlled by contact rollers 1220, 1222, 1260 and 1262. The upper rollers 1260 and 1262 are preferably made from a soft elastic material having low hardness so as not to damage the formed structures (e.g. such as the nanowires) during the fabrication process, and appropriate temperature resistance for the processes being carried out. According to some embodiments, station 1200 is used in a start-stop fabrication process. However, according to some embodiments, station 1200 is used in a continuous processing method in which the substrate 1242 is continuously advanced without stopping.

Figure 13:
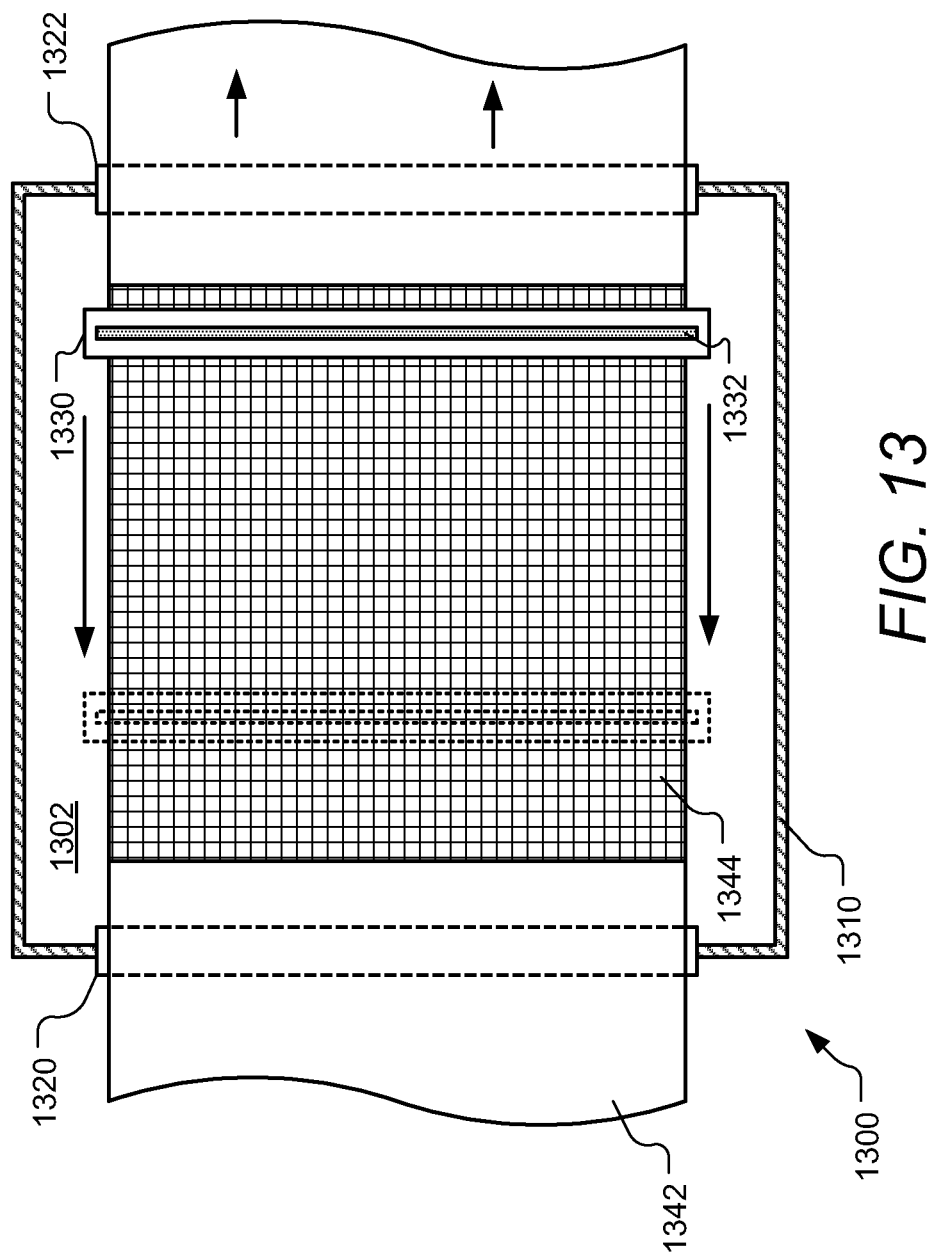
FIG. 13 is a plan view of a processing station used to spray on nanowire catalyst material, according to some embodiments.

FIG. 13 is a plan view of a processing station used to spray on nanowire catalyst material, according to some embodiments. The processing station 1300 corresponds, for example, to station 716 in FIG. 7 and is used for uniformly depositing a catalyst material such as gold or titanium is at a large number of spots on substrate 1342, with each spot being a location at which a nanowire will be grown. Processing chamber 1302 is defined by chamber wall 1310 and gas communication between the chamber 1302 and the outside, which could be a buffer chamber, is controlled by rollers such as rollers 1320 and 1322. The area 1344 on continuous substrate 1342 is where the PV solar cells are being fabricated. A spray assembly 1330 includes a wide spray head 1332 that is made up of a large number of nozzles. According to some embodiments, the nozzles are similar to inkjet nozzles used in inkjet technology. During operation, the spray assembly 1330 is translated across fabrication area 1344 (as denoted by the arrows and small dotted lines in FIG. 13) such that the liquid spray, and therefore the suspended nano particles of catalyst material, is uniformly deposited across the area 1344.

According to some embodiments, a processing station similar to that shown in FIG. 13 is used for depositing spray on glass. In such embodiments, the nozzles 1332 in head 1330 are dimensioned and spaced according to the viscosity of the liquid being deposited.

Figure 14:
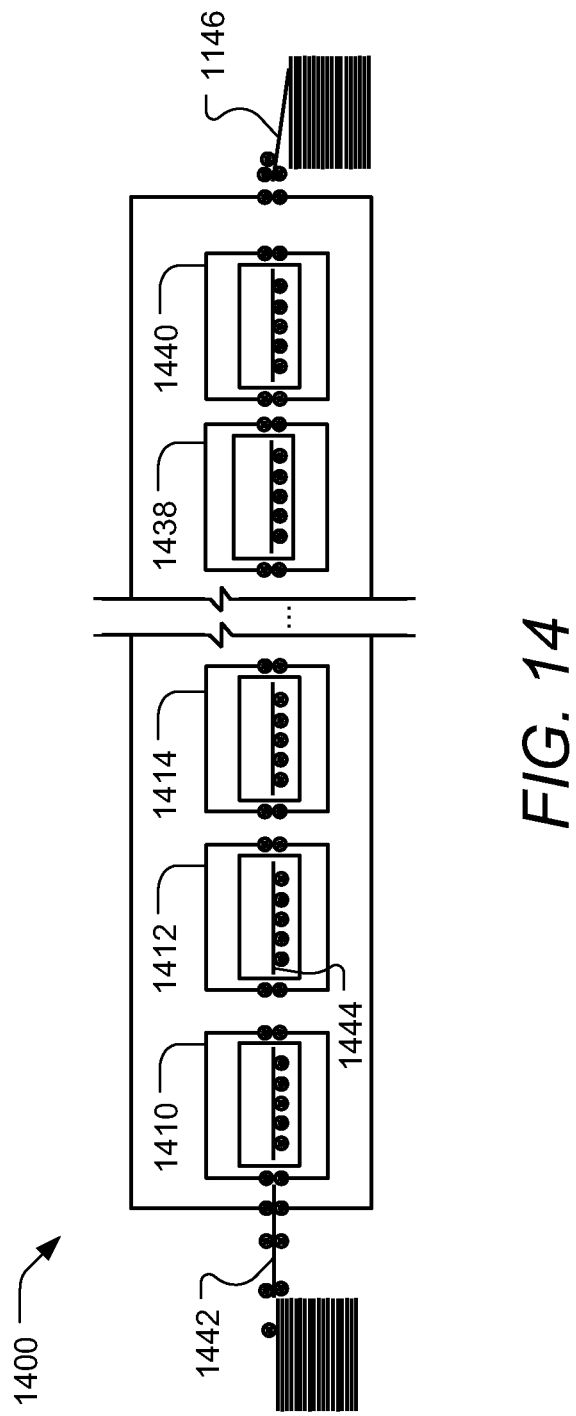
FIG. 14 schematically illustrates a large area discrete substrate manufacturing process for PV nanowire-based solar cells, according to some embodiments.

FIG. 14 schematically illustrates a large area discrete substrate manufacturing process for PV nanowire-based solar cells, according to some embodiments. Fabrication line 1400 is similar to line 800 shown in FIGS. 8A and 8B except that prior to processing, the substrate is cut into discrete pieces corresponding to the size of the processing stations. For example, according to some embodiments, the processing stations 1410, 1412, 1414, 1438 and 1440 are all 1 meter×1 meter format, and the discrete substrate pieces, such as piece 1442, 1444, and 1446 are also 1 m×1 m.

Figure 15:
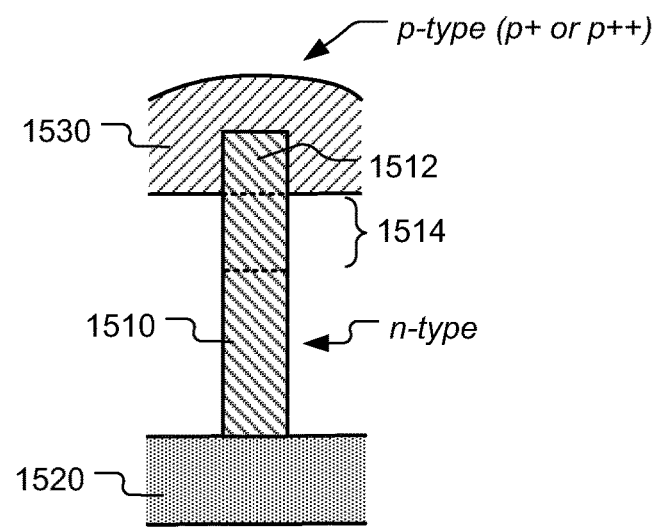
FIG. 15 illustrate a structure that includes an n-doped PV nanowire and a heavily doped p-type tip-side electrode material, according to some embodiments.

FIG. 15 illustrates a structure that includes a lightly n-doped PV nanowire and a more heavily doped p-type tip-side electrode material, according to some embodiments. Instead of an intrinsic PV nanowire, as described herein according to some other embodiments, the PV nanowire 1510 is intentionally lightly doped n-type (e.g. n⁻ type) on an n-type substrate 1520. For example, the n-type doping of PV nanowire 1510 can be intentionally doped to an impurity level in the range of $10^{14}$ to $10^{16}$ per cubic centimeter. A heavily p+ type cap 1530 is formed, which can be p+ or p++ type doping. Due to heavily doped p-type cap 1530, the tip region 1512 of the nanowire becomes p-type. Furthermore, a depletion region 1514 is caused in the lightly doped PV nanowire due to field strength and the relative doping levels. The depletion region 1514, can range in size, for example, from 0.2 microns to 3 microns. According to some embodiments, a depletion region of about 1 micron in height can result from an PV nanowire intentionally doped to an impurity level of about $10^{16}$ per cubic centimeter. According to some embodiments, lightly-doped PV nanowires such as the one shown in FIG. 15 can be combined with the other teachings and techniques as described herein.

Although the description herein is directed primarily to PV nanowires made of III-V compound semiconductors such as InP, the scope of the present teachings is not necessarily so limited. More generally, the PV nanowires can be composed of various combinations of elemental and compound semiconductors optimized for different spectrum ranges in the solar spectrum. The elemental semiconductors include silicon ("Si") and germanium ("Ge"), and compound semiconductors include group III-V and II-VI materials (the Roman numerals III and V representing elements in the group IIIa and Va on the periodic table). Compound semiconductors can be composed of group IIIa elements, such as Aluminum ("Al"), Gallium ("Ga"), and Indium ("In"), in combination with group Va elements, such as Nitrogen ("N"), Phosphorus ("P"), Arsenic ("As"), and Antimony ("Sb"). Compound semiconductors can be classified according the relative quantities of III and V elements. By way of example, binary compound semiconductors include GaAs, InP, InAs, GaN, and GaP; ternary compound semiconductors include $GaAs_yP_{1-y}$, where y ranges between 0 and 1; and quaternary compound semiconductors include $In_xGa_{1-x}As_yP_{1-y}$, where both x and y independently range between 0 and 1. Other types of suitable compound semiconductors include II-VI materials, the Roman numerals II and VI representing elements in group IIb and VIa on the periodic table. By way of example, CdSe, ZnSe, ZnS, and ZnO are examples of binary II-VI compound semiconductors.

In the case of using a stainless steel substrate or other non-transparent substrate, it is beneficial to optimize the filler layer, the dry etch to expose a large percentage of the micro-wires, the deposition of the a-Si layer to provide a p-type (or n-type) junction, and finally the TCL layer to optimize conductivity and optical transmissivity.

According to some embodiments, a protective encapsulation on the light incident side is provided, which consists of a sun-resistant transparent overcoat of polymer. See, for example, Pern and Glick, "Accelerated Exposure Tests of Encapsulated Si Solar Cells and Encapsulation Materials," National Center for Photovoltaics Program Review Meeting, Denver, Colo., Sep. 8-11, 1998, NREL/CP-520-25361 (October 1998), which is incorporated by reference herein in its entirety.

Whereas many alterations and modifications of the present invention will no doubt become apparent to a person of ordinary skill in the art after having read the foregoing description, it is to be understood that the particular embodiments shown and described by way of illustration are in no way intended to be considered limiting. By way of example, in another preferred embodiment, the i-region portion of each nanowire can be made very short, and the device can be operable as a light-emitting diode (LED) rather than a photovoltaic energy generation device. Therefore, reference to the details of the preferred embodiments is not intended to limit their scope.

What is claimed is:

1. A photovoltaic energy conversion device comprising:
   a substrate including an electrically conductive substrate surface layer doped in a first dopant type;
   a plurality of individually grown photovoltaic (PV) nanowires extending outwardly from the substrate surface layer, each of the plurality of individually grown PV nanowires having a root end near said substrate surface layer and a tip end opposite said root end, said substrate surface layer forming at least a portion of a root-side electrode layer of the device;
   a collar material crystallographically grown on and laterally surrounding the plurality of individually grown PV nanowires along at least a rootward portion of their lengths, the collar material doped in the first dopant type;
   a tip-side electrode material doped in a second dopant type, the tip-side electrode material being in contact with said tip ends of the plurality of individually grown PV nanowires; and an optically transparent, electrically insulating filler material directly laterally surrounding the plurality of individually grown PV nanowires along an outward portion of their lengths.

2. A device according to claim 1 wherein a longitudinal p-i-n junction is associated with each of the plurality of individually grown PV nanowires.

3. A device according to claim 1 wherein a gap between 0.2 microns and 5 microns is formed between an outwardmost portion of the collar material and a rootward most portion of the tip-side material.

4. A device according to claim 1 wherein the plurality of individually grown PV nanowires are not intentionally doped.

5. A device according to claim 1 in which the plurality of individually grown PV nanowires comprise catalytically grown material and the collar material comprises a crystallographically grown material on the catalytically grown material.

6. A device according the claim 1 in which the plurality of individually grown PV nanowires and the collar material are made of the same material except for dopants.

* * * * *